US012803535B2

(12) United States Patent
Lee et al.

(10) Patent No.: US 12,803,535 B2
(45) Date of Patent: Nov. 17, 2026

(54) CIRCUIT CAPABLE OF AUTOMATICALLY ADJUSTING IMPEDANCE THEREOF

(71) Applicant: UNIVERSITY OF SEOUL INDUSTRY COOPERATION FOUNDATION, Seoul (KR)

(72) Inventors: Ju-Seung Lee, Seoul (KR); Hyeong-Min Ko, Seoul (KR); Jae-Hun Oh, Seoul (KR); Min-Geun Jin, Seoul (KR); Yongsam Moon, Gwacheon-si (KR)

(73) Assignee: UNIVERSITY OF SEOUL INDUSTRY COOPERATION FOUNDATION, Seoul (KR)

( * ) Notice: Subject to any disclaimer, the term of this patent is extended or adjusted under 35 U.S.C. 154(b) by 36 days.

(21) Appl. No.: 19/064,134

(22) Filed: Feb. 26, 2025

(65) Prior Publication Data

US 2026/0074678 A1 Mar. 12, 2026

(30) Foreign Application Priority Data

Sep. 12, 2024 (KR) ........................ 10-2024-0124569

(51) Int. Cl.

| | |
|---|---|
| ***H03H 11/30*** | (2006.01) |
| ***H03H 17/00*** | (2006.01) |
| ***H03K 19/00*** | (2006.01) |
| ***H03K 19/0944*** | (2006.01) |

(52) U.S. Cl.
CPC ........ *H03H 11/30* (2013.01); *H03H 17/0045* (2013.01); *H03K 19/0005* (2013.01); *H03K 19/0944* (2013.01)

(58) Field of Classification Search
CPC ............... H03H 11/30; H03H 17/0045; H03K 19/0005; H03K 19/0944
See application file for complete search history.

(56) References Cited

U.S. PATENT DOCUMENTS 7,295,033 B2 * 11/2007 Chung ................ H04L 25/0278 327/108
2023/0370050 A1 * 11/2023 Wen ..................... G11C 29/028

FOREIGN PATENT DOCUMENTS

KR 10-1204672 B1 11/2012
KR 10-2359600 B1 2/2022

* cited by examiner

*Primary Examiner* — Daniel D Chang
(74) *Attorney, Agent, or Firm* — Stein IP, LLC

(57) ABSTRACT

The present invention provides a circuit capable of automatically adjusting impedance thereof having a wide adjustment range and high accuracy by selecting a pull-up code and a pull-down code for obtaining resistances closest to those of a first reference resistor and a second reference resistor, respectively, using a first reference P-code and a second reference P-code, and a first reference N-code and a second reference N-code.

10 Claims, 27 Drawing Sheets

<Prior Art>

<Prior Art>

<Prior Art>

<Prior Art>

<Prior Art>

CIRCUIT CAPABLE OF AUTOMATICALLY ADJUSTING IMPEDANCE THEREOF

CROSS-REFERENCE TO RELATED PATENT APPLICATION

This non-provisional U.S. patent application claims priority under 35 U.S.C. § 119 of Korean Patent Application No. 10-2024-0124569 filed on Sep. 12, 2024, in the KIPO, the entire contents of which are hereby incorporated by reference.

BACKGROUND OF THE INVENTION

1. Field

The present invention relates to a circuit capable of automatically adjusting impedance thereof, and more particularly, to a circuit capable of automatically adjusting impedance thereof having a wide adjustment range and high accuracy. The present invention was derived as a result of research sponsored by Ministry of Trade, Industry and Energy, titled "Development of Multiprotocol-Multilink High Speed Interface PHY Supporting Multiple Bandwidth" (Project No. 2024052420).

2. Description of the Related Art

Generally, a transmitter and a receiver are equipped with a termination resistor having a constant resistance (e.g., 50Ω) to minimize signal reflection and increase the efficiency of signal transmission.

There are two types of termination methods: off-chip termination and on-chip termination. The off-chip termination is a method wherein a termination resistor of, for example, 50Ω is connected to a chip from the outside of the chip. The off-chip termination is advantageous in that termination resistance can be adjusted relatively accurately. However, there are three problems of the off-chip termination. First, the parasitic component of the packaging used for connecting the external termination resistor acts as a stub and generates an undesirable reflection signal, thereby causing a problem of signal distortion. Second, the disadvantage of the external termination resistor is that the transmission of a differential signal requires two external resistor elements. Third, in the case of a voltage-mode driver, it is difficult to make a termination resistor with an external resistor. This is because the driver transistor is included when making 50Ω resistor. Due to such problems described above, the general trend is to use the on-chip termination, where a termination resistor is provided inside the chip. However, since the resistor value of the on-chip termination resistor changes depending on the PVT (process, voltage, temperature) conditions, a resistance adjusting circuit is essential to adjust the termination resistance to 50Ω.

FIGS. 1A and 1B are circuit diagrams illustrating a conventional analog PMOS resistance adjusting circuit and a conventional analog NMOS resistance adjusting circuit, respectively.

Referring to FIG. 1A, the resistance of the PMOS transistor $MP_1$ is adjusted by an analog voltage $V_{COMP1}$ such that the sum of the resistances of the PMOS transistors $MP_1$ and $MP_2$ and the resistance of an internal resistor $R_P$ is equal to the resistance of an external reference resistor $R_{EXT}$.

Referring to FIG. 1B, the resistance of the NMOS transistor $MN_1$ is adjusted by the analog voltage $V_{COMP2}$ such that the sum of the resistances of the NMOS transistors $MN_1$ and $MN_2$ and the resistance of an internal resistor $R_N$ is equal to the resistance of an external reference resistor $R_{EXT}$.

The analog PMOS resistance adjusting circuit and the analog NMOS resistance adjusting circuit illustrated in FIGS. 1A and 1B, respectively, are advantageous in that accurate resistance can be obtained. However, the same is disadvantageous in that the resistance adjustment ranges thereof are small. Considering that resistance may typically vary by up to 15% due to PVT variations, the analog PMOS resistance adjusting circuit and the analog NMOS resistance adjusting circuit may not be able to sufficiently respond to the variation in resistance due to PVT variations.

FIGS. 2A and 2B are circuit diagrams illustrating a conventional digital PMOS resistance adjusting circuit and a conventional digital NMOS resistance adjusting circuit, respectively.

Referring to FIG. 2A, K count of PMOS transistors $MP_1$, $MP_2$, . . . , $MP_{(K-1)}$ and $MP_K$ connected in parallel are selectively turned on or off using a pull-up code [K-1:0] (abbreviated a "P-UP CODE" in FIGS. 2A, 3, 4 and 17) to render the sum of: the resistance $MP_1||MP_2||$ . . . $||MP_{(K-1)}||MP_K$ of the PMOS transistors $MP_1$, $MP_2$, . . . , $MP_{(K-1)}$ and $MP_K$ connected in parallel; the resistance of the PMOS transistor $MP_0$; and the resistance of the internal resistor $R_P$ as close as possible to the resistance of the external reference resistor $R_{EXT}$ (where K is a natural number).

A pull-up code generator compares the voltage across the external reference resistor $R_{EXT}$ to $0.5\times V_{DD}$ and generates the pull-up code [K-1:0] that renders the sum of: the resistance $MP_1||MP_2||$ . . . $MP_{(K-1)}||MP_K$ of the PMOS transistors $MP_1$, $MP_2$, . . . , $MP_{(K-1)}$ and $MP_K$ connected in parallel; the resistance of the PMOS transistor $MP_0$; and the resistance of the internal resistor $R_P$ as close as possible to the resistance of the external reference resistor $R_{EXT}$.

Referring to FIG. 2B, K count of NMOS transistors $MN_1$, $MN_2$, . . . , $MN_{(K-1)}$ and $MN_K$ are selectively turned on or off using a pull-down code [K-1:0] (abbreviated a "P-DOWN CODE" in FIGS. 2B, 3, 4 and 17) to render the sum of: the resistance $MN_1||MN_2||$ . . . $||MN_{(K-1)}||MN_K$ of the NMOS transistors $MN_1$, $MN_2$, . . . , $MN_{(K-1)}$ and $MN_K$ connected in parallel; the resistance of the NMOS transistor $MN_0$; and the resistance of the internal resistor $R_N$ as close as possible to the resistance of the external reference resistor $R_{EXT}$ The pull-down code generator compares the voltage across the external reference resistor $R_{EXT}$ to $0.5\times V_{DD}$ and generates the pull-down code [K-1:0] that renders the sum of: the resistance $MN_1||MN_2||$ . . . $||MN_{(K-1)}||MN_K$ of the NMOS transistors $MN_1$, $MN_2$, . . . , $MN_{(K-1)}$ and $MN_K$ connected in parallel; the resistance of the NMOS transistor $MN_0$; and the resistance of the internal resistor $R_N$ as close as possible to the resistance of the external reference resistor $R_{EXT}$.

The pull-up code [K-1:0] and the pull-down code [K-1:0] determined through the above-described process are applied to the voltage-mode driver illustrated in FIG. 3.

FIG. 3 is a circuit diagram illustrating a conventional voltage-mode driver.

Referring to FIG. 3, the pull-up code [K-1:0] is applied to the PMOS transistors $MP_{D11}$, $MP_{D12}$, . . . , $MP_{D1(K-1)}$ and $MP_{D1K}$, and the pull-down code [K-1:0] is applied to the NMOS transistors $MN_{D11}$, $MN_{D12}$, . . . , $MN_{D1(K-1)}$ and $MN_{D1K}$. Here, depending on the input $IN_P$ and $IN_N$, only one of the PMOS path and the NMOS path is turned on, and when the corresponding cell is viewed from the $OUT_P$ and $OUT_N$, the resistance of each cell including the resistor $R_{INT}$ becomes as close as possible to the resistance of the target resistor $R_{EXT}$.

A technology for adjusting impedance using the above-described pull-up code and pull-down code is disclosed in Korean Patent No. 10-1204672.

According to Patent No. 10-1204672, when repeating between the two codes closest to 50Ω, an end signal is generated, and one of the two codes is arbitrarily selected as the pull-down code or the pull-up code. However, when one of the two codes is arbitrarily selected, there is a probability of 50% that the code that is further from 50Ω is selected as the pull-down code or the pull-up code.

SUMMARY OF THE INVENTION

It is an object of the present invention to provide a circuit capable of automatically adjusting impedance thereof having a wide adjustment range and high accuracy.

A circuit capable of automatically adjusting impedance thereof according to a first embodiment of the present invention includes: a first voltage divider comprising: a first pull-up resistor and a second pull-up resistor connected in parallel and having resistances, respectively, varying according to a reference P-code applied thereto; and a first reference resistor having a constant resistance and connected in series with the first pull-up resistor and the second pull-up resistor connected in parallel, a pull-up code selector sequentially applying: a first reference P-code and the first reference P-code; the first reference P-code and a second reference P-code; and the second reference P-code and the second reference P-code to the first pull-up resistor and the second pull-up resistor, respectively; a first comparator providing a comparison value $V_{COMP1}$ to the pull-up code selector wherein the comparison value $V_{COMP1}$ is obtained by comparing $0.5\times V_{DD}$ to a voltage $VD_{IV1}$ across the first reference resistor when a voltage $V_{DD}$ is applied to the first voltage divider; a second voltage divider comprising: a second reference resistor having a resistance varying according to a pull-up code applied by the pull-up code selector; and a first pull-down resistor and a second pull-down resistor connected in parallel and having resistances, respectively, varying according to a reference N-code applied thereto wherein the first pull-down resistor and the second pull-down resistor are connected in series with the second reference resistor; a pull-down code selector sequentially applying: a first reference N-code and the first reference N-code; the first reference N-code and a second reference N-code; and the second reference N-code and the second reference N-code to the first pull-down resistor and the second pull-down resistor, respectively; and a second comparator providing a comparison value $V_{COMP2}$ to the pull-down code selector wherein the comparison value $V_{COMP2}$ is obtained by comparing $0.5\times V_{DD}$ to a voltage $V_{DIV2}$ across the first pull-down resistor and the second pull-down resistor when the voltage $V_{DD}$ is applied to the second voltage divider, wherein the first comparator performs a comparison each time the reference P-code is applied and provides three comparison values $V_{COMP1}$ to the pull-up code selector, the pull-up code selector selects one of the first reference P-code and the second reference P-code as a pull-up code based on the three comparison values $V_{COMP1}$, the pull-up code minimizing a difference between: a resistance of the first reference resistor; and a resistance of the first pull-up resistor and the second pull-up resistor connected in parallel, the second comparator performs a comparison each time the reference N-code is applied and provides three comparison values $V_{COMP2}$ to the pull-down code selector, and the pull-down code selector selects one of the first reference N-code and the second reference N-code as a pull-down code based on the three comparison values $V_{COMP2}$, the pull-down code minimizing the difference between: a resistance of the second reference resistor; and a resistance of the first pull-down resistor and the second pull-down resistor connected in parallel (where [second reference P-code] is equal to [first reference P-code+1], and [second reference N-code] is equal to [first reference N-code+1]).

The reference P-code includes binary data of K bits, and each of the first pull-up resistor and the second pull-up resistor includes K counts of PMOS transistors provided with gates having the binary data of K bits applied thereto, respectively (where K is a natural number).

The three comparison values $V_{COMP1}$ include a first comparison value, a second comparison value and a third comparison value, and the pull-up code selector selects the first reference P-code as the pull-up code when the first comparison value=1, the second comparison value=0 and the third comparison value=0 are satisfied, and selects the second reference P-code as the pull-up code when the first comparison value=1, the second comparison value=1 and the third comparison value=0 are satisfied.

The pull-up code selector: (i) increases each of the first reference P-code and the second reference P-code by 1 and then sequentially applies increased first reference P-code and increased second reference P-code to the first pull-up resistor and the second pull-up resistor when the first comparison value=1, the second comparison value=1, and the third comparison value=1 are satisfied; and (ii) selects one of the increased first reference P-code and the increased second reference P-code as the pull-up code based on comparison values of the first comparator obtained from the increased first reference P-code and the increased second reference P-code, the pull-up code minimizing the difference between: the resistance of the first reference resistor; and the resistance of the first pull-up resistor and the second pull-up resistor connected in parallel.

The pull-up code selector: (i) decreases each of the first reference P-code and the second reference P-code by 1 and then sequentially applies decreased first reference P-code and decreased second reference P-code to the first pull-up resistor and the second pull-up resistor when the first comparison value=0, the second comparison value=0, and the third comparison value=0 are satisfied; and (ii) selects one of the decreased first reference P-code and the decreased second reference P-code as the pull-up code based on comparison values of the first comparator obtained from the decreased first reference P-code and the decreased second reference P-code, the pull-up code minimizing the difference between: the resistance of the first reference resistor; and the resistance of the first pull-up resistor and the second pull-up resistor connected in parallel.

The reference N-code includes binary data of K bits, and each of the first pull-down resistor and the second pull-down resistor includes K counts of NMOS transistors provided with gates having the binary data of K bits applied thereto, respectively (where K is a natural number).

The three comparison values $V_{COMP2}$ include a first comparison value, a second comparison value and a third comparison value, and the pull-down code selector selects the first reference N-code as the pull-down code when the first comparison value=1, the second comparison value=0 and the third comparison value=0 are satisfied, and selects the second reference N-code as the pull-down code when the first comparison value=1, the second comparison value=1 and the third comparison value=0 are satisfied.

The pull-down code selector: (i) increases each of the first reference N-code and the second reference N-code by 1 and then sequentially applies increased first reference N-code and increased second reference N-code to the first pull-down resistor and the second pull-down resistor when the first comparison value=1, the second comparison value=1, and the third comparison value=1 are satisfied; and (ii) selects one of the increased first reference N-code and the increased second reference N-code as the pull-down code based on comparison values of the second comparator obtained from the increased first reference N-code and the increased second reference N-code, the pull-down code minimizing the difference between: the resistance of the second reference resistor; and the resistance of the first pull-down resistor and the second pull-down resistor connected in parallel.

The pull-down code selector: (i) decreases each of the first reference N-code and the second reference N-code by 1 and then sequentially applies decreased first reference N-code and decreased second reference N-code to the first pull-down resistor and the second pull-down resistor when the first comparison value=0, the second comparison value=0, and the third comparison value=0 are satisfied; and (ii) selects one of the decreased first reference N-code and the decreased second reference N-code as the pull-down code based on comparison values of the second comparator obtained from the decreased first reference N-code and the decreased second reference N-code, the pull-down code minimizing the difference between: the resistance of the first reference resistor; and the resistance of the first pull-down resistor and the second pull-down resistor connected in parallel.

A circuit capable of automatically adjusting impedance thereof according to a second embodiment of the present invention includes: a first voltage divider including: a first pull-down resistor and a second pull-down resistor connected in parallel and having resistances, respectively, varying according to a reference N-code applied thereto; and a first reference resistor having a constant resistance and connected in series with the first pull-down resistor and the second pull-down resistor connected in parallel, a pull-down code selector sequentially applying: a first reference N-code and the first reference N-code; the first reference N-code and a second reference N-code; and the second reference N-code and the second reference N-code to the first pull-down resistor and the second pull-down resistor, respectively; a first comparator providing a comparison value $V_{COMP1}$ to the pull-down code selector wherein the comparison value $V_{COMP1}$ is obtained by comparing $0.5 \times V_{DD}$ to a voltage $V_{DIV1}$ across the first pull-down resistor and the second pull-down resistor connected in parallel when a voltage $V_{DD}$ is applied to the first voltage divider; a second voltage divider including: a second reference resistor having a resistance varying according to a pull-down code applied by the pull-down code selector; and a first pull-up resistor and a second pull-up resistor connected in parallel and having resistances, respectively, varying according to a reference P-code applied thereto wherein the first pull-up resistor and the second pull-up resistor are connected in series with the second reference resistor; a pull-up code selector sequentially applying: a first reference P-code and the first reference P-code; the first reference P-code and a second reference P-code; and the second reference P-code and the second reference P-code to the first pull-up resistor and the second pull-up resistor, respectively; and a second comparator providing a comparison value $V_{COMP2}$ to the pull-up code selector wherein the comparison value $V_{COMP2}$ is obtained by comparing $0.5 \times V_{DD}$ to a voltage $V_{DIV2}$ across the second reference resistor when the voltage $V_{DD}$ is applied to the second voltage divider, wherein the first comparator performs a comparison each time the reference N-code is applied and provides three comparison values $V_{COMP1}$ to the pull-down code selector, the pull-down code selector selects one of the first reference N-code and the second reference N-code as a pull-down code based on the three comparison values $V_{COMP1}$, the pull-down code minimizing a difference between: a resistance of the first reference resistor; and a resistance of the first pull-down resistor and the second pull-down resistor connected in parallel, the second comparator performs a comparison each time the reference P-code is applied and provides three comparison values $V_{COMP2}$ to the pull-up code selector, and the pull-up code selector selects one of the first reference P-code and the second reference P-code as a pull-up code based on the three comparison values $V_{COMP2}$, the pull-up code minimizing the difference between: a resistance of the second reference resistor; and a resistance of the first pull-up resistor and the second pull-up resistor connected in parallel (where [second reference N-code] is equal to [first reference N-code+1], and [second reference P-code] is equal to [first reference P-code+1]).

DETAILED DESCRIPTION OF THE INVENTION

Hereinafter, a circuit capable of automatically adjusting impedance thereof according to the present invention will be described in detail with reference to the accompanying drawings.

Figure 1A:
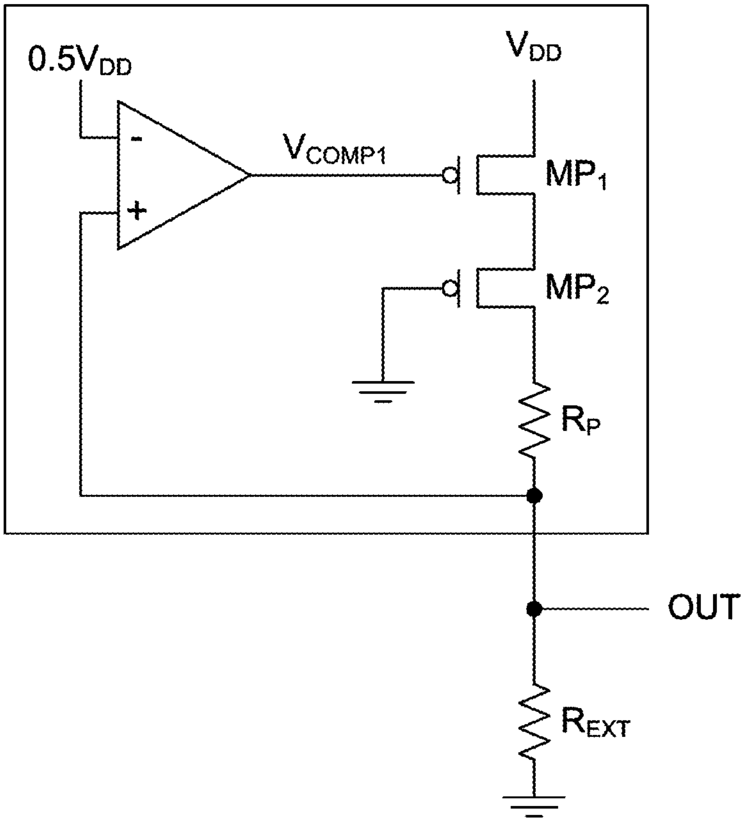
FIGS. 1A and 1B are circuit diagrams illustrating a conventional analog PMOS resistance adjusting circuit and a conventional analog NMOS resistance adjusting circuit, respectively.
Figure 1B:
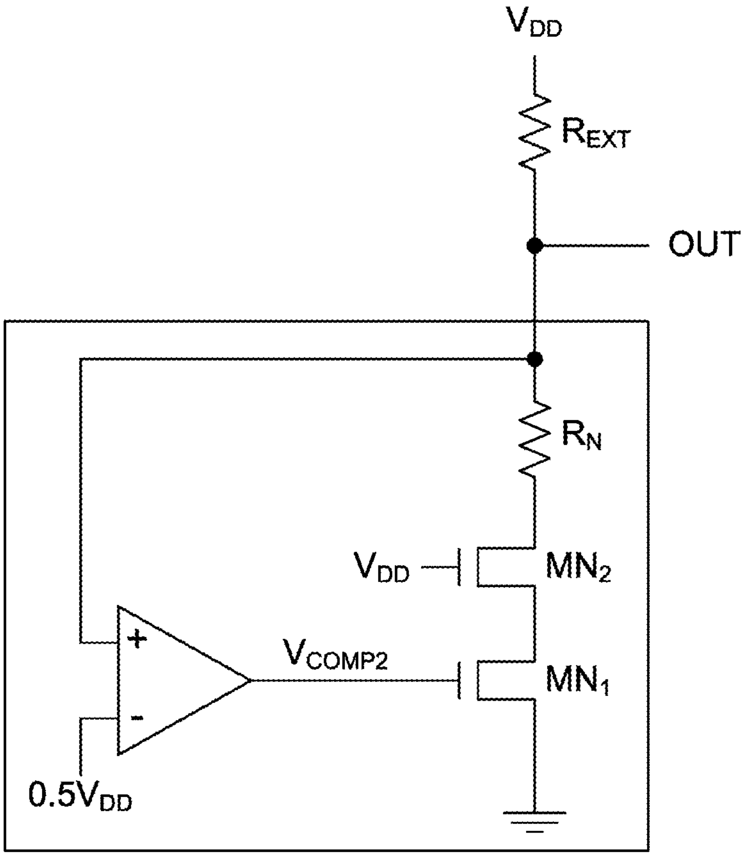
Figure 2A:
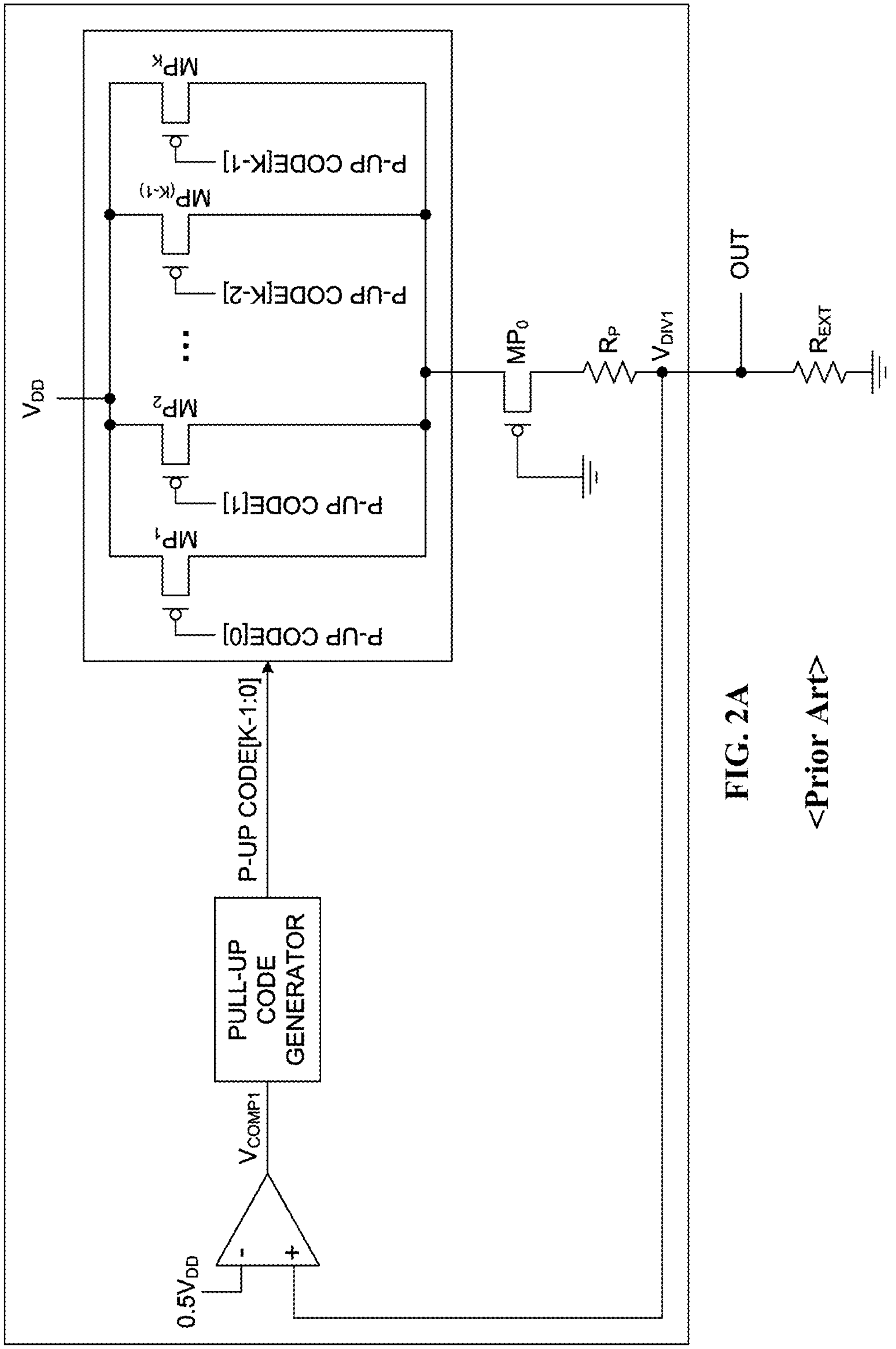
FIGS. 2A and 2B are circuit diagrams illustrating a conventional digital PMOS resistance adjusting circuit and a conventional digital NMOS resistance adjusting circuit, respectively.
Figure 2B:
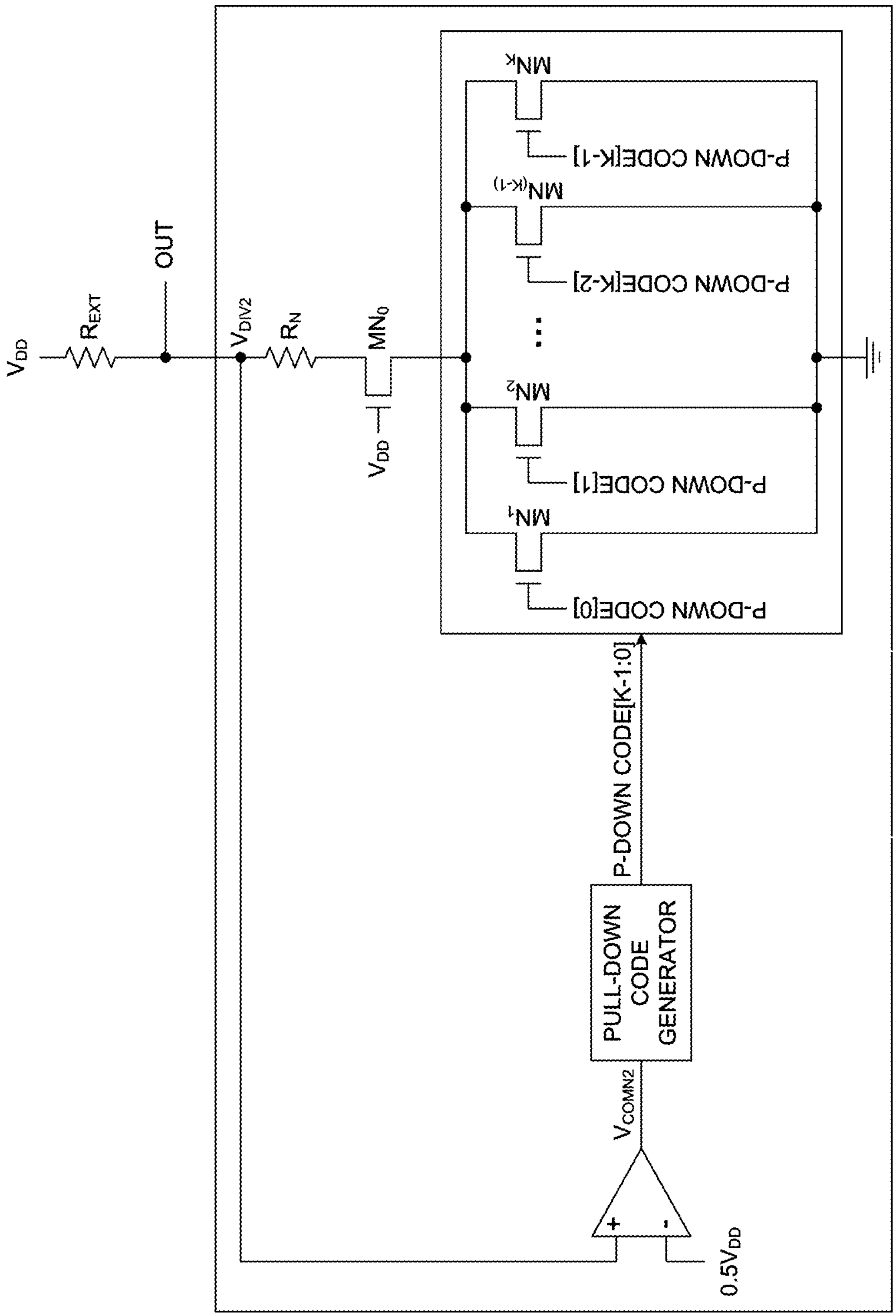
Figure 3:
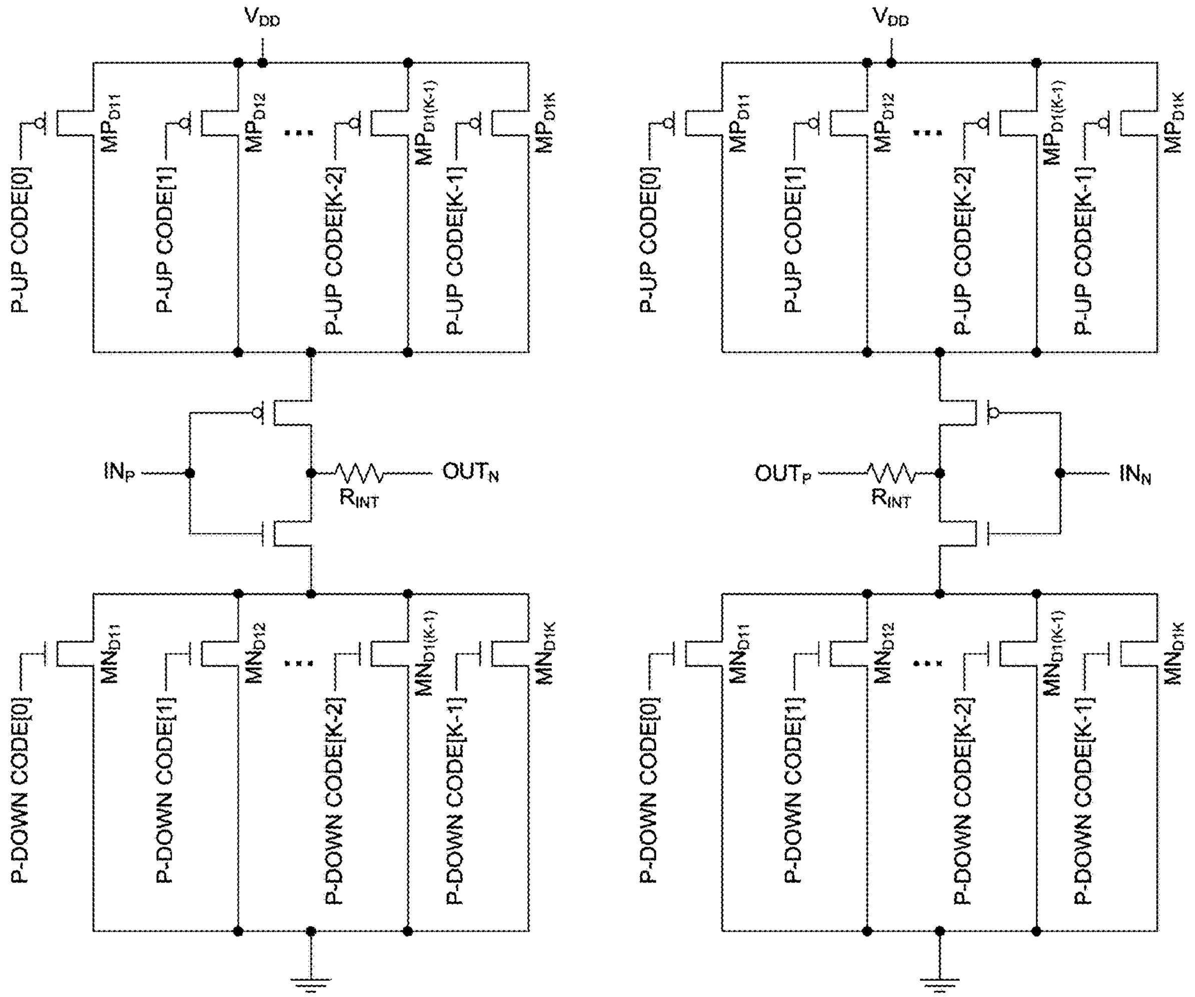
FIG. 3 is a circuit diagram illustrating a conventional voltage-mode driver.
Figure 4:
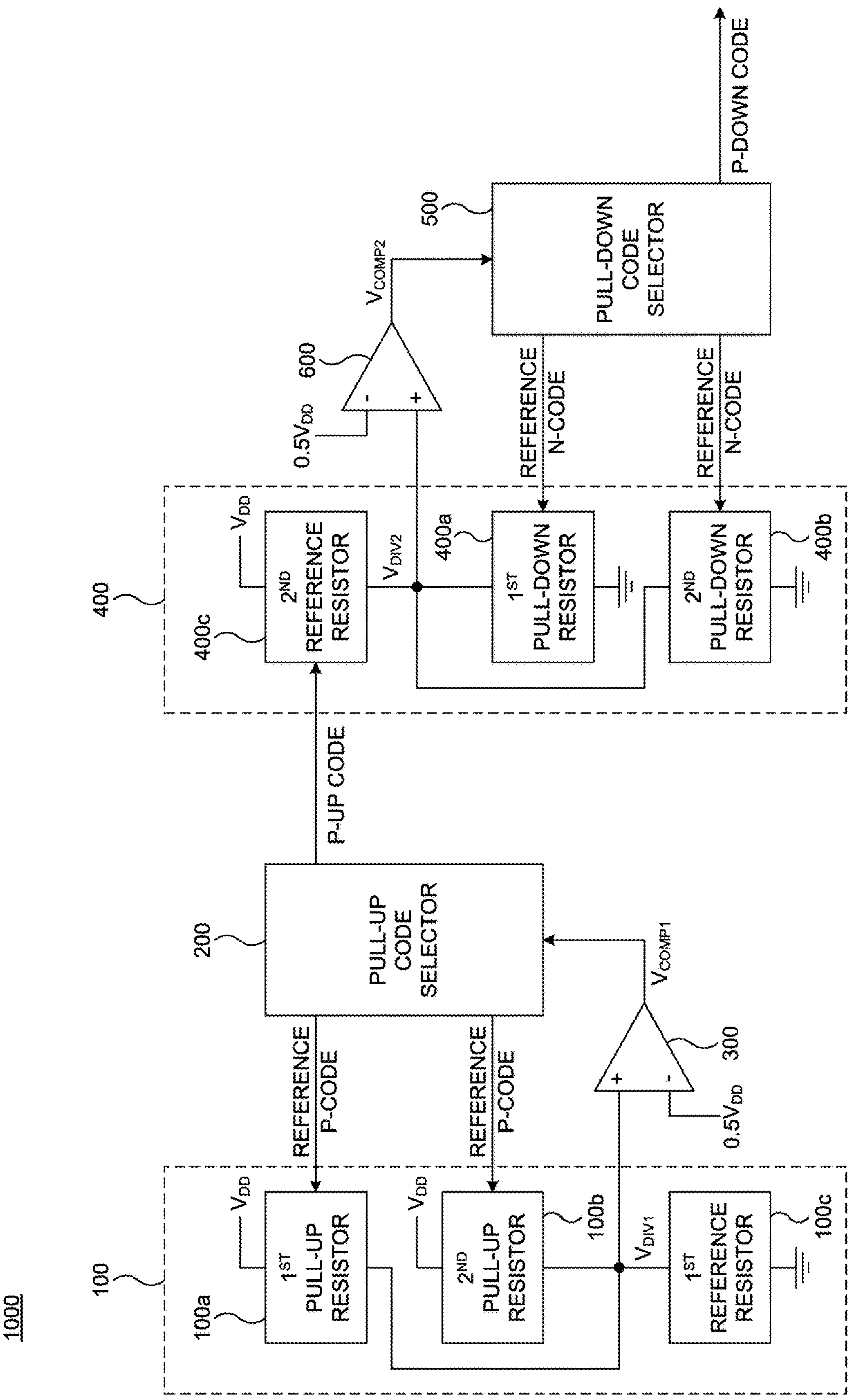
FIG. 4 is a circuit diagram illustrating a circuit capable of automatically adjusting impedance thereof according to a first embodiment of the present invention.

FIG. 4 is a circuit diagram illustrating a circuit capable of automatically adjusting impedance thereof according to a first embodiment of the present invention.

Referring to FIG. 4, a circuit 1000 capable of automatically adjusting impedance thereof according to the first embodiment of the present invention includes: a first voltage divider 100; a pull-up code selector 200; a first comparator 300; a second voltage divider 400; a pull-down code selector 500; and a second comparator 600.

The first voltage divider 100 includes: a first pull-up resistor 100*a*; a second pull-up resistor 100*b*; and a first reference resistor 100*c*.

The resistance of the first pull-up resistor 100*a* changes according to a reference P-code [K-1:0] of K bits applied thereto (where K is a natural number).

The resistance of the second pull-up resistor 100*b* connected in parallel with the first pull-up resistor 100*a* changes according to the reference P-code [K-1:0] of K bits applied thereto. The configuration of the second pull-up resistor 100*b* is substantially the same as that of the first pull-up resistor 100*a*.

The first reference resistor 100*c* has a constant resistance (e.g., 50Ω) and is connected in series with the first pull-up resistor 100*a* and the second pull-up resistor 100*b* connected in parallel.

The configuration of the first pull-up resistor 100*a* (or the second pull-up resistor 100*b*) will be described in detail with reference to FIG. 5.

Figure 5:
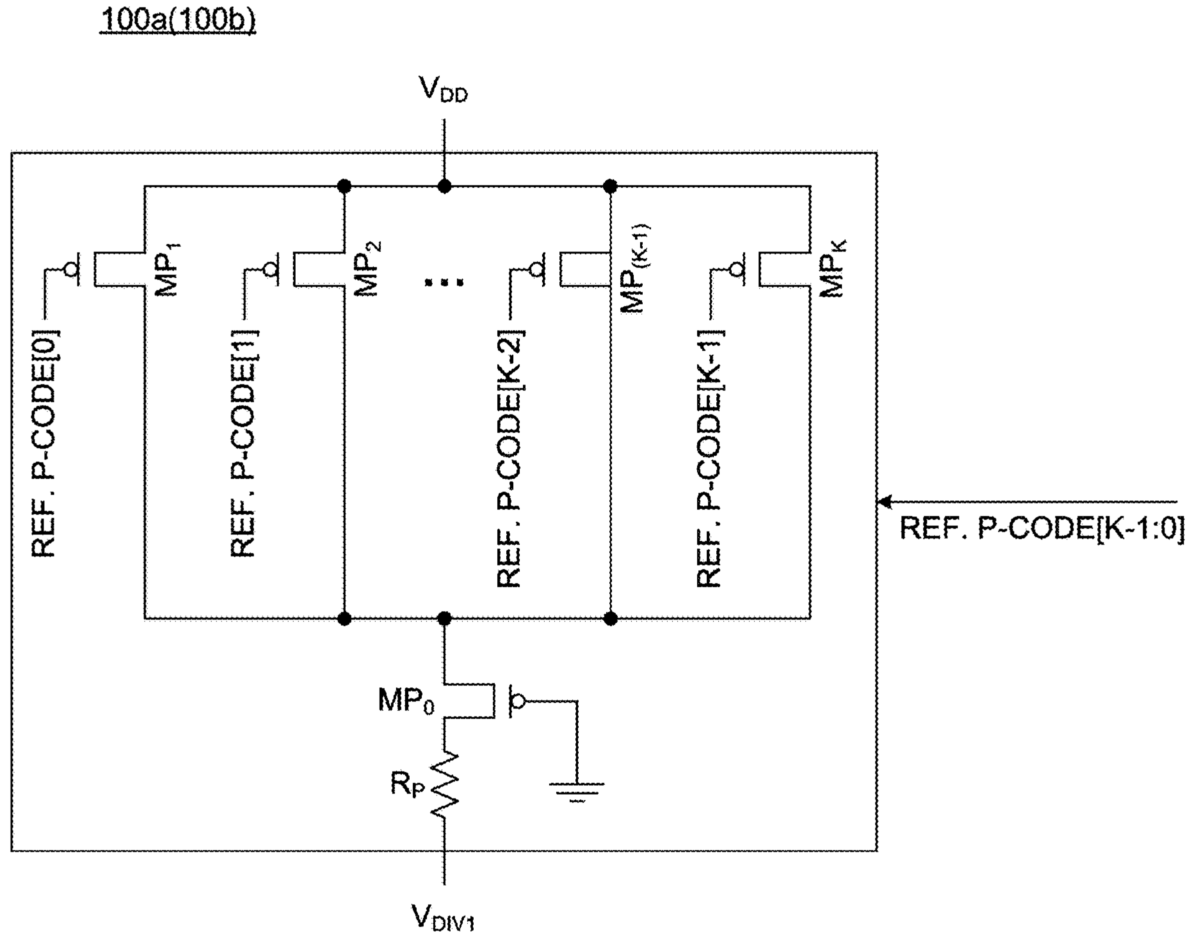
FIG. 5 is a circuit diagram illustrating a first pull-up resistor (or second pull-up resistor) according to the present invention.

FIG. 5 is a circuit diagram illustrating the first pull-up resistor 100*a* (or the second pull-up resistor 100*b*) according to the present invention.

Referring to FIG. 5, the first pull-up resistor 100*a* includes: K count of PMOS transistors $MP_1$ to $MP_K$ connected in parallel; a PMOS transistor $MP_0$; and a resistor $R_P$.

The K count of PMOS transistors $MP_1$ to $MP_K$ are turned on or turned off according to the reference P-code [K-1:0] (abbreviated as "REF. P-CODE" in FIGS. 5, 9 and 11) applied thereto. That is, the resistance of the first pull-up resistor 100*a* changes depending on the sum of the channel width (or area) that varies according to the number of PMOS transistors turned on (or turned off) among the K count of PMOS transistors $MP_1$ to $MP_K$.

For example, when "0111", which is a 4-bit reference P-code [3:0], is applied, "H" (i.e., reference P-code [0]), "H" (i.e., reference P-code [1]), "H" (i.e., reference P-code [2]), and "L" (i.e., reference P-code [3]) are applied to the PMOS transistors $MP_1$ to $MP_4$, respectively. As a result, the PMOS transistors $MP_1$ to $MP_4$ are turned off, turned off, turned off, and turned on, respectively.

The resistance of the first pull-up resistor 100*a* is $(MP_1\|MP_2\| \ldots \|MP_{(K-1)}\|MP_K)+MP_0+RP$. Therefore, it should be understood that the resistance of the first pull-up=resistor 100*a* changes based on the sum of the channel width (or area) that varies according to the number of the PMOS transistors $MP_1$ to $MP_K$ that are turned on (or turned off).

Since the configuration of the second pull-up resistor 100*b* is the same as that of the first pull-up resistor 100*a*, the resistance of the second pull-up resistor 100*b* changes depending on the sum of the channel width (or area) that varies according to the number of the PMOS transistors $MP_1$ to $MP_K$ that are turned on (or turned off).

It is preferable that the median of the range of the resistance of the first pull-up resistor 100*a* be approximately twice the resistance of the first reference resistor 100*c*. That is, the resistance of the first pull-up resistor 100*a* varies around twice the resistance of the first reference resistor 100*c*. The same applies to the second pull-up resistor 100*b*. Therefore, when the first pull-up resistor 100*a* and the second pull-up resistor 100*b* are connected in parallel, their resistance varies around the resistance of the first reference resistor 100*c*.

In addition, the resistance of each transistor may be adjusted by properly designing the size of the channel width (or area) of the transistors constituting the first pull-up resistor 100*a* and the second pull-up resistor 100*b*, and accordingly, the resistances of the first pull-up resistor 100*a* and the second pull-up resistor 100*b* are adjusted. For example, the resistances of the first pull-up resistor 100*a* and the second pull-up resistor 100*b* may be designed to increase as the value of the applied reference P-code increases.

Referring back to FIG. 4, a voltage $V_{DD}$ is applied to the first voltage divider 100, and the applied voltage $V_{DD}$ is divided according to the resistances of the first pull-up resistor 100*a*, the second pull-up resistor 100*b*, and the first reference resistor 100*c*.

For example, when the resistances of the first pull-up resistor 100*a*, the second pull-up resistor 100*b*, and the first reference resistor 100*c* are $R_{P1}$, $R_{P2}$, and $R_{REF1}$, respectively, the voltage $V_{DIV1}$ across the first reference resistor 100*c* is as shown in Equation 1 below.

$$V_{DIV1} = \frac{R_{REF1}}{(R_{P1}\|R_{P2}) + R_{REF1}} \times V_{DD} \quad \text{[Equation 1]}$$

That is, the voltage $V_{DIV1}$ varies depending on the resistance $R_{P1}\|R_{P2}$ which is the resistance of the first pull-up resistor 100*a* and the second pull-up resistor 100*b* connected in parallel. Here, since each of $R_{P1}$ and $R_{P2}$ vary around $2\times R_{REF1}$, $R_{P1}\|R_{P2}$ varies around $R_{REF1}$.

Still referring to FIG. 4, the pull-up code selector 200 applies the reference P-code [K-1:0] to the first pull-up resistor 100*a* and the second pull-up resistor 100*b*, respectively.

The reference P-code [K-1:0] may include a first reference P-code [K-1:0] and a second reference P-code [K-1:0]. Here, the first reference P-code [K-1:0] and the second reference P-code [K-1:0] satisfy the relationship: second reference P-code [K-1:0]=first reference P-code [K-1:0]+1.

That is, the second reference P-code [K-1:0] is binary data of K bits that is greater than the first reference P-code [K-1:0] by 1.

For example, when 4-bit first reference P-code [3:0] is "1000", a second reference P-code [3:0] is "1001".

The pull-up code selector 200 sequentially applies: the first reference P-code [K-1:0] and the first reference P-code [K-1:0] to the first pull-up resistor 100*a* and the second pull-up resistor 100*b*, respectively; the first reference P-code [K-1:0] and the second reference P-code [K-1:0] to the first pull-up resistor 100*a* and the second pull-up resistor 100*b*, respectively; and the second reference P-code [K-1:0] and the second reference P-code [K-1:0] to the first pull-up resistor 100*a* and the second pull-up resistor 100*b*, respectively.

For example, the pull-up code selector 200 may apply: "1000" and "1000" to the first pull-up resistor 100*a* and the second pull-up resistor 100*b*, respectively, "1000" and "1001" to the first pull-up resistor 100*a* and the second pull-up resistor 100*b*, respectively, and "1001" and "1001" to the first pull-up resistor 100*a* and the second pull-up resistor 100*b*, respectively. However, the order of application may be changed.

The resistances of the first pull-up resistor 100*a* and the second pull-up resistor 100*b* varies depending on the first reference P-code [K-1:0] and second reference P-code [K-1:0] applied thereto. Therefore, when "1000" and "1000", "1000" and "1001", "1001" and "1001" are applied for example, three different resistances are generated, resulting in three different voltages $V_{DIV1}$.

The first comparator 300 compares the voltage $V_{DIV1}$ to $0.5\times V_{DD}$ and provides the resulting comparison value $V_{COMP1}$ to the pull-up code selector 200.

Specifically, as described above, since three different voltages $V_{DIV1}$ are generated when the first reference P-code [K-1:0] and the second reference P-code [K-1:0] are applied to the first pull-up resistor 100*a* and the second pull-up resistor 100*b*, the first comparator 300 compares each of the three voltages $V_{DIV1}$ to $0.5\times V_{DD}$ and provides the three comparison values $V_{COMP1}$ to the pull-up code selector 200.

For example, the first comparator 300 outputs $V_{COMP1}=1$ when $V_{DIV1}>0.5\times V_{DD}$, and outputs $V_{COMP1}=0$ when $VDIV1\leq 0.5\times V_{DD}$.

The pull-up code selector 200 selects, based on three comparison values $V_{COMP1}$, one of the first reference P-code [K-1:0] and the second reference P-code [K-1:0] as a pull-up code [K-1:0] which minimizes the difference between $R_{P1}||R_{P2}$ and $R_{REF1}$. This process will be described later.

The second voltage divider 400 includes: a first pull-down resistor 400*a*; a second pull-down resistor 400*b*; and a second reference resistor 400*c*.

The resistance of the second reference resistor 400*c* changes according to the pull-up code [K-1:0] applied by the pull-up code selector 200. The second reference resistor 400*c* is connected in series with the first pull-down resistor 400*a* and the second pull-down resistor 400*b*, which are connected in parallel.

The configuration of the second reference resistor 400*c* is described in detail with reference to FIG. 6.

Figure 6:
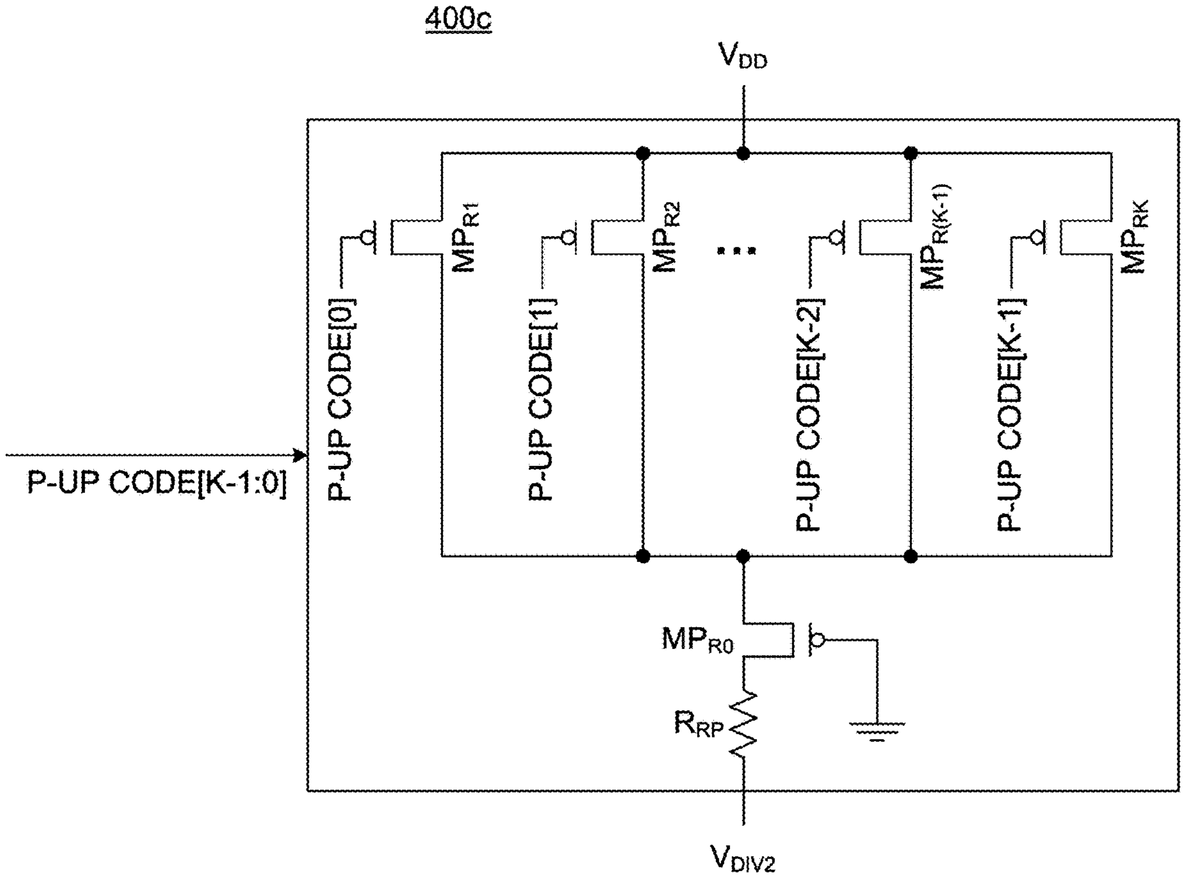
FIG. 6 is a circuit diagram illustrating a second reference resistor according to the present invention.

FIG. 6 is a circuit diagram illustrating the second reference resistor 400*c* according to the present invention.

Referring to FIG. 6, the second reference resistor 400*c* according to the present invention includes: K count of PMOS transistors $MP_{R1}$ to $MP_{RK}$ connected in parallel; a PMOS transistor $MP_{R0}$; and a resistor $R_{RP}$.

The configuration of the second reference resistor 400*c* is substantially the same as that of the first pull-up resistor 100*a* (or the second pull-up resistor 100*b*) described above. That is, the K count of PMOS transistors $MP_{R1}$ to $MP_{RK}$ are turned on or off according to the pull-up code [K-1:0] applied thereto, and thus the resistance thereof varies. However, the resistance of the second reference resistor 400*c* varies around the resistance of the first reference resistor 100*c*.

The resistance of the first pull-down resistor 400*a* changes according to the reference N-code [K-1:0] of K bits applied thereto.

The resistance of the second pull-down resistor 400*b* connected in parallel with the first pull-down resistor 400*a* changes according to the reference N-code [K-1:0] of K bits. The configuration of the second pull-down resistor 400*b* is substantially the same as that of the first pull-down resistor 400*a*.

Figure 7:
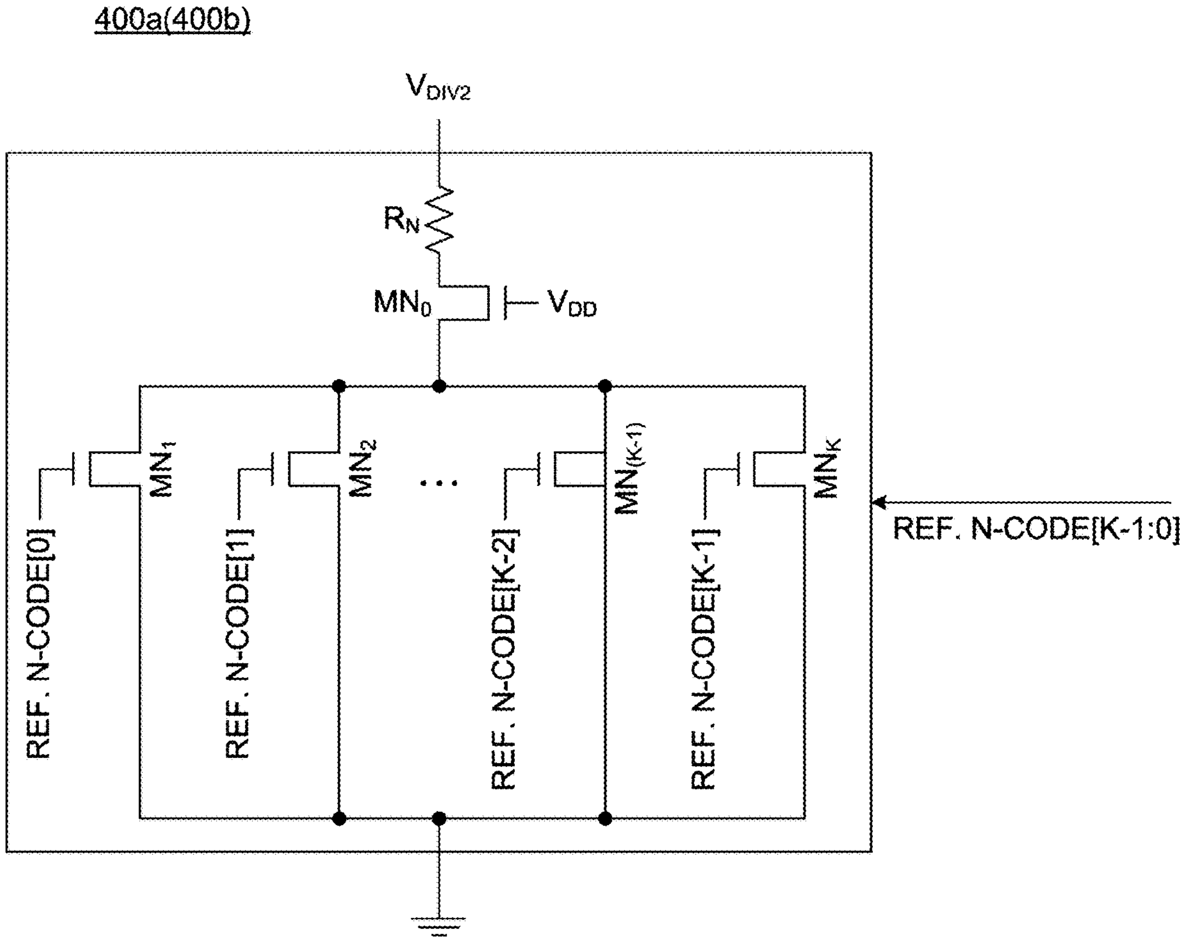
FIG. 7 is a circuit diagram illustrating a first pull-down resistor (or second pull-down resistor) according to the present invention.

FIG. 7 is a circuit diagram illustrating the first pull-down resistor 400*a* (or the second pull-down resistor 400*b*) according to the present invention.

Referring to FIG. 7, the first pull-down resistor 400*a* includes: K count of NMOS transistors $MN_1$ to $MN_K$ connected in parallel, an NMOS transistor $MN_0$, and a resistor $R_N$.

The K count of NMOS transistors $MN_1$ to $MN_K$ are turned on or turned off according to the reference N-code [K-1:0] (abbreviated as "REF. N-CODE" in FIGS. 7, 14 and 16) applied thereto. That is, the resistance of the first pull-down resistor 400*a* changes depending on the sum of the channel width (or area) that varies according to the number of NMOS transistors turned on (or turned off) among the K count of NMOS transistors $MN_1$ to $MN_K$.

For example, when "0111", which is a 4-bit reference N-code [3:0], is applied, "H" (i.e., reference N-code [0]), "H" (i.e., reference N-code [1]), "H" (i.e., reference N-code [2]), and "L" (i.e., reference N-code [3]) are applied to the NMOS transistors $MN_1$ to $MN_4$, respectively. As a result, the NMOS transistors $MN_1$ to $MN_4$ are turned on, turned on, turned on, and turned off, respectively.

The resistance of the first pull-down resistor 400*a* is $(MN_1||MN_2|| \ldots ||MN_{(K-1)}||MN_K)+MN_0+R_N$. Therefore, it should be understood that the resistance of the first pull-down resistor 400*a* changes based on the sum of the channel width (or area) that varies according to the number of the NMOS transistors $MN_1$ to $MN_K$ that are turned on (or turned off).

Since the configuration of the second pull-down resistor 400*b* is the same as that of the first pull-down resistor 400*a*, the resistance of the second pull-down resistor 400*b* changes depending on the sum of the channel width (or area) that varies according to the number of the NMOS transistors $MN_1$ to $MN_K$ that are turned on (or turned off).

It is preferable that the median of the range of the resistance of the first pull-down resistor 400*a* be approximately twice the resistance of the second reference resistor 400*c*. That is, the resistance of the first pull-down resistor 400*a* varies around twice the resistance of the second reference resistor 400*c*. The same applies to the second pull-down resistor 400*b*. Therefore, when the first pull-down resistor 400*a* and the second pull-down resistor 400*b* are connected in parallel, their resistance varies around the resistance of the second reference resistor 400*c*.

In addition, the resistance of each transistor may be adjusted by properly designing the size of the channel width (or area) of the transistors constituting the first pull-down resistor 400*a* and the second pull-down resistor 400*b*, and accordingly, the resistances of the first pull-down resistor 400*a* and the second pull-down resistor 400*b* are adjusted.

For example, the resistances of the first pull-down resistor 400_a_ and the second pull-down resistor 400_b_ may be designed to decrease as the value of the applied reference N-code increases.

Referring back to FIG. 4, a voltage $V_{DD}$ is applied to the second voltage divider 400, and the applied voltage $V_{DD}$ is divided according to the resistances of the second reference resistor 400_c_, the first pull-down resistor 400_a_, and the second pull-down resistor 400_b_.

For example, when the resistances of the second reference resistor 400_c_, the first pull-down resistor 400_a_, and the second pull-down resistor 400_b_ are $R_{REF2}$, $R_{N1}$, and $R_{N2}$, respectively, the voltage $V_{DIV2}$ across the first pull-down resistor 400_a_ and the second pull-down resistor 400_b_ connected in parallel is as shown in Equation 2 below.

$$V_{DIV2} = \frac{(R_{N1}\|R_{N2})}{(R_{N1}\|R_{N2}) + R_{REF2}} \times V_{DD} \quad \text{[Equation 2]}$$

That is, the voltage $V_{DIV2}$ varies depending on the resistance $R_{N1}\|R_{N2}$ which is the resistance of the first pull-down resistor 400_a_ and the second pull-down resistor 400_b_ connected in parallel. Here, since each of $R_{N1}$ and $R_{N2}$ vary around $2\times R_{REF2}$, $R_{N1}\|R_{N2}$ varies around $R_{REF2}$.

Still referring to FIG. 4, the pull-down code selector 500 applies the reference N-code [K-1:0] to the first pull-down resistor 400_a_ and the second pull-down resistor 400_b_, respectively.

The reference N-code [K-1:0] may include a first reference N-code [K-1:0] and a second reference N-code [K-1:0]. Here, the first reference N-code [K-1:0] and the second reference N-code [K-1:0] satisfy the relationship: second reference N-code [K-1:0]=first reference N-code [K-1:0]+1. That is, the second reference N-code [K-1:0] is binary data of K bits that is greater than the first reference N-code [K-1:0] by 1.

For example, when 4-bit first reference N-code [3:0] is "0111", a second reference N-code [3:0] is "1000".

The pull-down code selector 500 sequentially applies: the first reference N-code [K-1:0] and the first reference N-code [K-1:0] to the first pull-down resistor 400_a_ and the second pull-down resistor 400_b_, respectively; the first reference N-code [K-1:0] and the second reference N-code [K-1:0] to the first pull-down resistor 400_a_ and the second pull-down resistor 400_b_, respectively; and the second reference N-code [K-1:0] and the second reference N-code [K-1:0] to the first pull-down resistor 400_a_ and the second pull-down resistor 400_b_, respectively.

For example, the pull-down code selector 500 may apply: "0111" and "0111" to the first pull-down resistor 400_a_ and the second pull-down resistor 400_b_, respectively, "0111" and "1000" to the first pull-down resistor 400_a_ and the second pull-down resistor 400_b_, respectively, and "1000" and "1000" to the first pull-down resistor 400_a_ and the second pull-down resistor 400_b_, respectively. However, the order of application may be changed.

The resistances of the first pull-down resistor 400_a_ and the second pull-down resistor 400_b_ varies depending on the first reference N-code [K-1:0] and second reference N-code [K-1:0] applied thereto. Therefore, when "0111" and "0111", "0111" and "1000", "1000" and "1000" are applied for example, three different resistances are generated, resulting in three different voltages $V_{DIV2}$.

The second comparator 600 compares the voltage $V_{DIV2}$ to $0.5\times V_{DD}$ and provides the resulting comparison value $V_{COMP2}$ to the pull-down code selector 500.

Specifically, as described above, since three different voltages $V_{DIV2}$ are generated when the first reference N-code [K-1:0] and the second reference N-code [K-1:0] are applied to the first pull-down resistor 400_a_ and the second pull-down resistor 400_b_, the second comparator 600 compares each of the three voltages $V_{DIV2}$ to $0.5\times V_{DD}$ and provides the three comparison values $V_{COMP2}$ to the pull-down code selector 500.

For example, the second comparator 600 outputs $V_{COMP2}=1$ when $V_{DIV2}>0.5\times V_{DD}$, and outputs $V_{COMP2}=0$ when $V_{DIV2}\leq 0.5\times V_{DD}$.

The pull-down code selector 500 selects, based on three comparison values $V_{COMP2}$, one of the first reference N-code [K-1:0] and the second reference N-code [K-1:0] as a pull-down code [K-1:0] which minimizes the difference between $R_{N1}\|R_{N2}$ and $R_{REF2}$. This process will be described later.

Hereinafter, the operation of the circuit capable of automatically adjusting impedance thereof according to the present invention will be described in detail with reference to FIGS. 8A to 16.

First, in order to describe the pull-up code selection process of the pull-up code selector 200, it is assumed that K=4, the resistance $R_{REF1}$ of the first reference resistor 100_c_ is 50Ω, the resistance $R_{P1}$ of the first pull-up resistor 100_a_ and the resistance $R_{P2}$ of the second pull-up resistor 100_b_ are both 94Ω when the first reference P-code [3:0] ($=X_1$) is applied thereto, and the resistance $R_{P1}$ of the first pull-up resistor 100_a_ and the resistance $R_{P2}$ of the second pull-up resistor 100_b_ are both 102Ω when the second reference P-code [3:0] ($=X_1+1$) is applied.

Figure 8A:
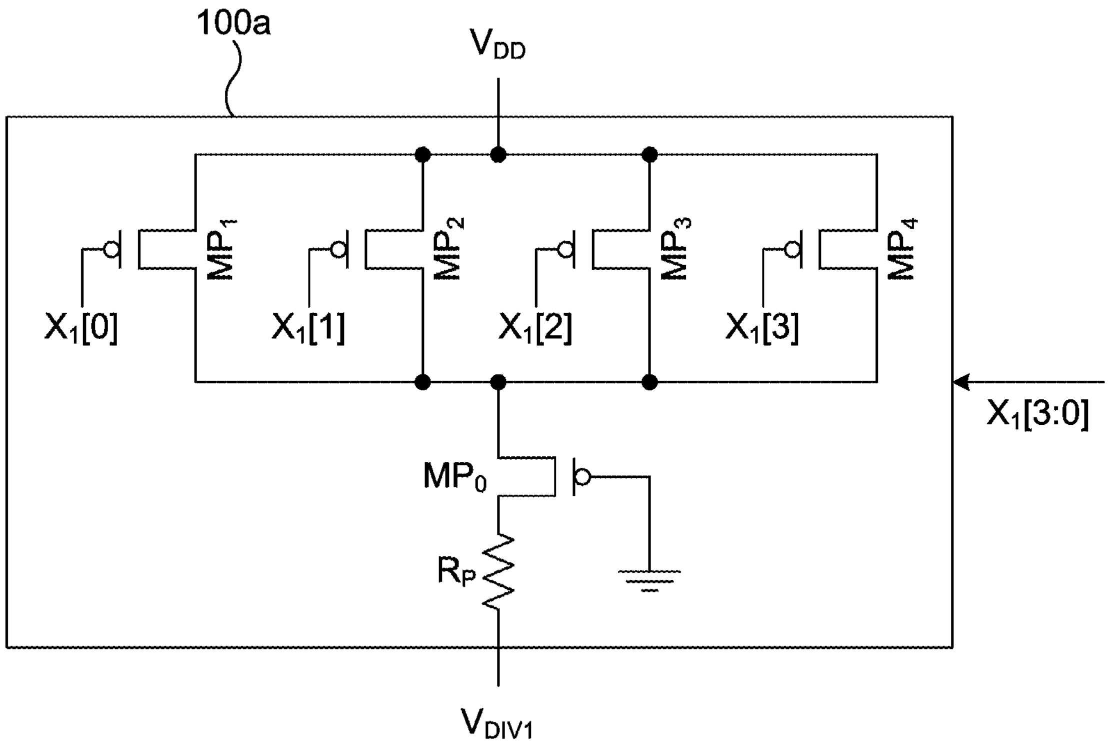
FIGS. 8A to 8C are circuit diagrams illustrating a first pull-up resistor and a second pull-up resistor, respectively, when reference P-codes $X_1$ and $X_1+1$ are applied according to the present invention.
Figure 8A:
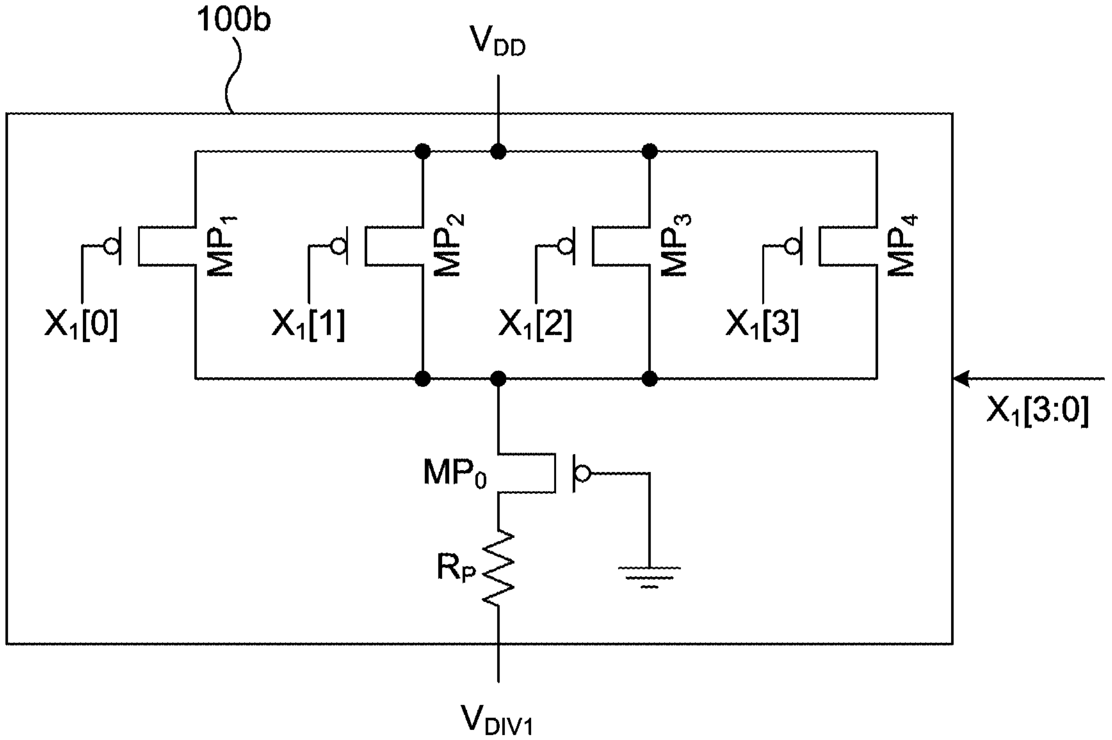
Figure 8B:
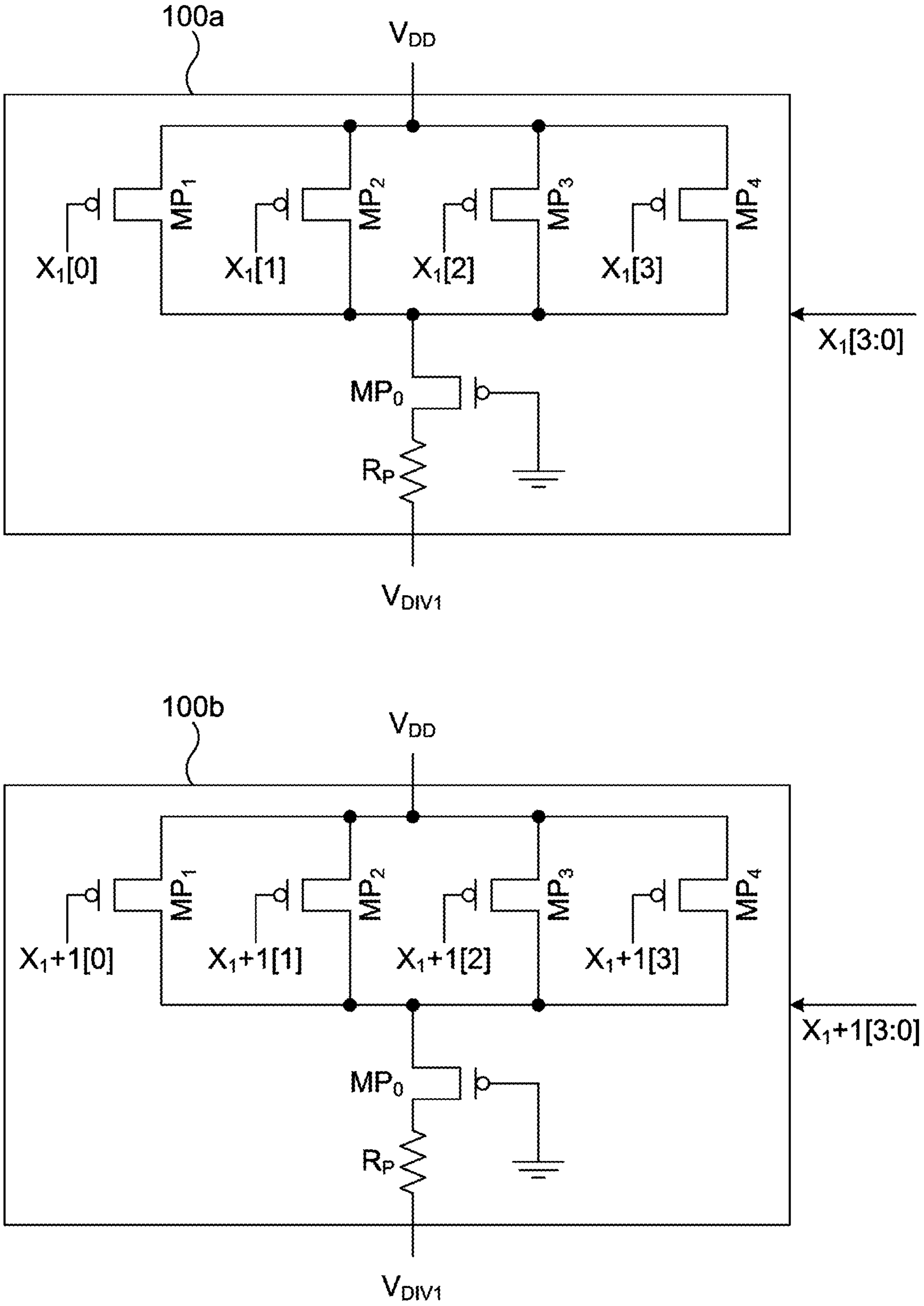
Figure 8C:
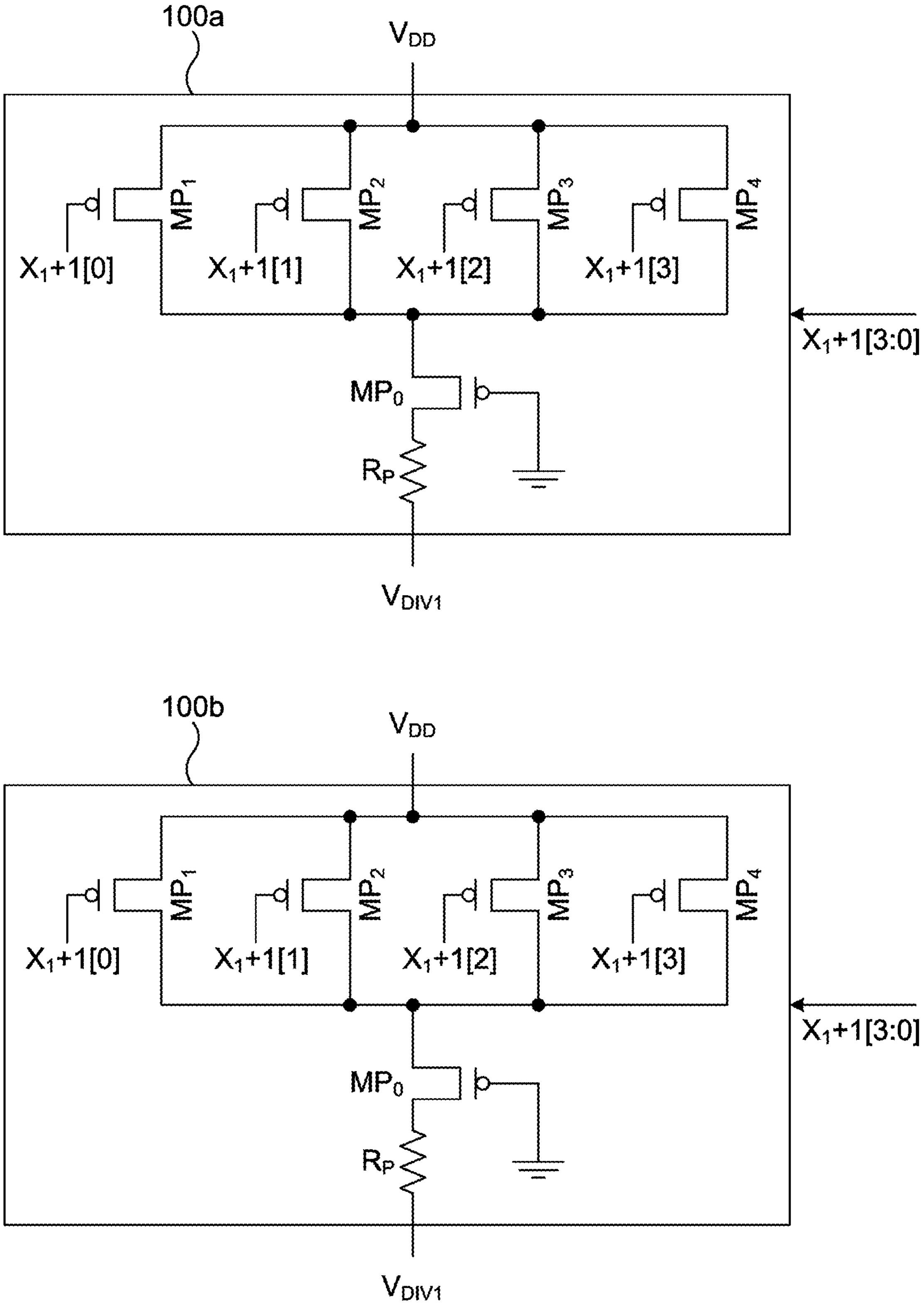

FIGS. 8A to 8C are circuit diagrams illustrating the first pull-up resistor 100_a_ and the second pull-up resistor 100_b_, respectively, when the first reference P-code [3:0] ($=X_1$) and the second reference P-code [3:0] ($=X_1+1$) are applied according to the present invention.

First, referring to FIG. 8A, the first reference P-code [3:0] ($=X_1$) is applied to each of the first pull-up resistor 100_a_ and the second pull-up resistor 100_b_.

When $X_1$ is applied to each of the first pull-up resistor 100_a_ and the second pull-up resistor 100_b_, the resistance $R_{P1}$ of the first pull-up resistor 100_a_ and the resistance $R_{P2}$ of the second pull-up resistor 100_b_ are both 94Ω. Thus, $R_{P1}\|R_{P2}=47\Omega$.

Here, the voltage $V_{DIV11}$ across the first reference resistor 100_c_ may be calculated from Equation 1 as shown in Equation 3 below.

$$V_{DIV11} = \frac{R_{REF1}}{(R_{P1}\|R_{P2}) + R_{REF1}} \times V_{DD} = \frac{50}{47+50} \times V_{DD} \approx 0.515V_{DD} \quad \text{[Equation 3]}$$

Next, referring to FIG. 8B, the first reference P-code [3:0] ($=X_1$) and the second reference P-code [3:0] ($=X_1+1$) are applied to the first pull-up resistor 100_a_ and the second pull-up resistor 100_b_, respectively.

When $X_1$ and $X_1+1$ are applied to the first pull-up resistor 100_a_ and the second pull-up resistor 100_b_, respectively, the resistance $R_{P1}$ of the first pull-up resistor 100_a_ and the resistance $R_{P2}$ of the second pull-up resistor 100_b_ are 94Ω and 102Ω, respectively. Thus, $R_{P1}\|R_{P2}\approx 49\Omega$.

Here, the voltage $V_{DIV12}$ across the first reference resistor 100c may be calculated from Equation 1 as shown in Equation 4 below.

[Equation 4]

$$V_{DIV12} = \frac{R_{REF1}}{(R_{P1}\|R_{P2}) + R_{REF1}} \times V_{DD} = \frac{50}{49+50} \times V_{DD} \approx 0.505V_{DD}$$

Next, referring to FIG. 8C, the second reference P-code [3:0] (=$X_1$+1) is applied to each of the first pull-up resistor 100a and the second pull-up resistor 100b.

When $X_1$+1 is applied to each of the first pull-up resistor 100a and the second pull-up resistor 100b, the resistance $R_{P1}$ of the first pull-up resistor 100a and the resistance $R_{P2}$ of the second pull-up resistor 100b are both 102Ω. Thus, $R_{P1}\|R_{P2}$=51Ω.

Here, the voltage $V_{DIV13}$ across the first reference resistor 100c may be calculated from Equation 1 as shown in Equation 5 below.

[Equation 5]

$$V_{DIV13} = \frac{R_{REF1}}{(R_{P1}\|R_{P2}) + R_{REF1}} \times V_{DD} = \frac{50}{51+50} \times V_{DD} \approx 0.495V_{DD}$$

The first comparator 300 sequentially compares voltages $V_{DIV11}$, $V_{DIV12}$ and $V_{DIV13}$ to 0.5×$V_{DD}$ and outputs the comparison value $V_{COMP1}$ for each of the voltages $V_{DIV11}$, $V_{DIV12}$ and $V_{DIV13}$.

The comparison values outputted by the first comparator 300 are: $V_{COMP11}$=1 (∵0.515×$V_{DD}$>0.5×$V_{DD}$); $V_{COMP12}$=1 (∵0.505×$V_{DD}$>0.5×$V_{DD}$); and $V_{COMP13}$=0 (∵0.495×$V_{DD}$<0.5×$V_{DD}$) where the first comparison value $V_{COMP11}$, the second comparison value $V_{COMP12}$ and the third comparison value $V_{COMP13}$ represent the comparison results for the voltages $V_{DIV11}$, $V_{DIV12}$ and $V_{DIV13}$, respectively.

Figure 9:
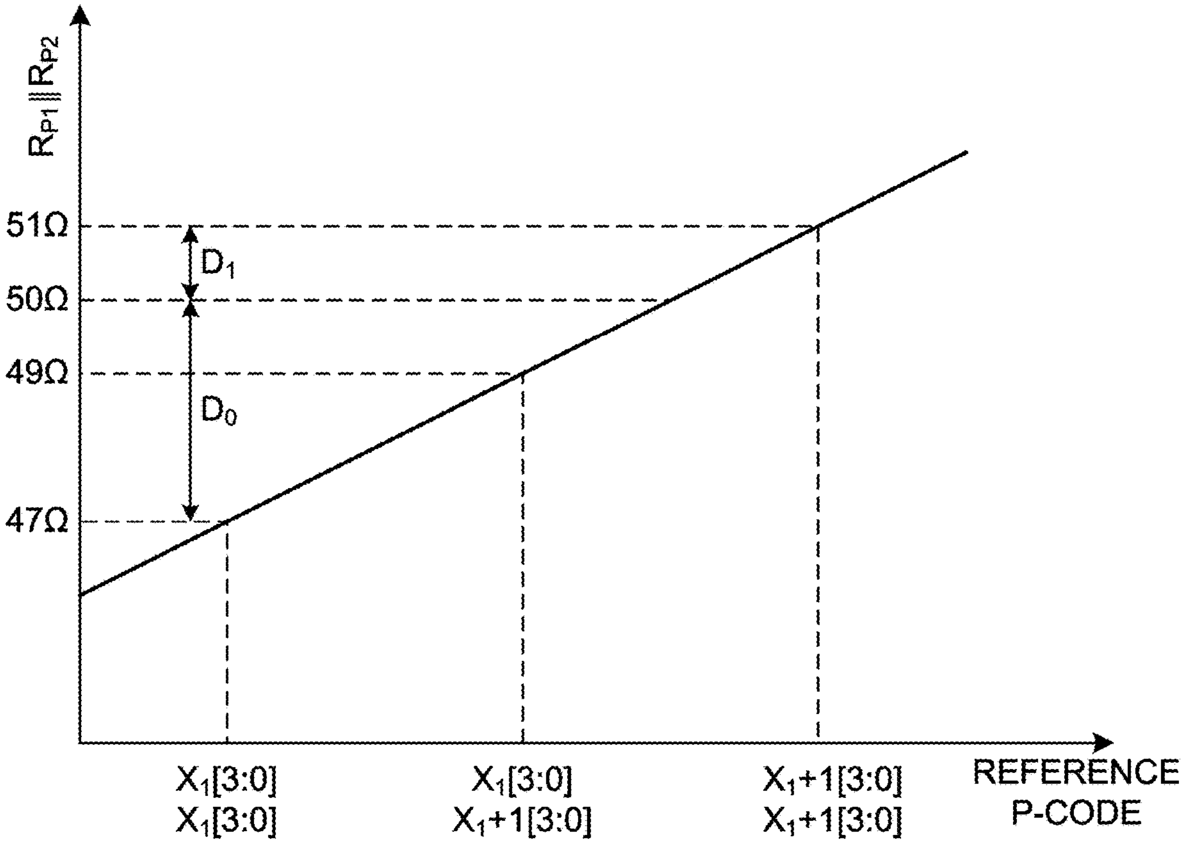
FIG. 9 is a graph illustrating resistances when the reference P-codes $X_1$ and $X_1+1$ are applied according to the present invention.

This change (1→1→0) of the first comparison value $V_{COMP11}$, the second comparison value $V_{COMP12}$ and the third comparison value $V_{COMP13}$ represents that $R_{P1}\|R_{P2}$ increases as the applied reference P-code increases, as shown in FIG. 9, and in particular, when $X_1$+1 is applied to each of the first pull-up resistor 100a and the second pull-up resistor 100b, $R_{P1}\|R_{P2}$ is then greater than 50Ω, which is the resistance $R_{REF1}$ of the first reference resistor 100c.

That is, as shown in FIG. 9, when $X_1$+1 is applied to each of the first pull-up resistor 100a and the second pull-up resistor 100b, the difference $D_1$ between the resistance $R_{P1}\|R_{P2}$ and the resistance $R_{REF1}$ of the first reference resistor 100c is minimum ($D_0$<$D_1$).

Figure 12:
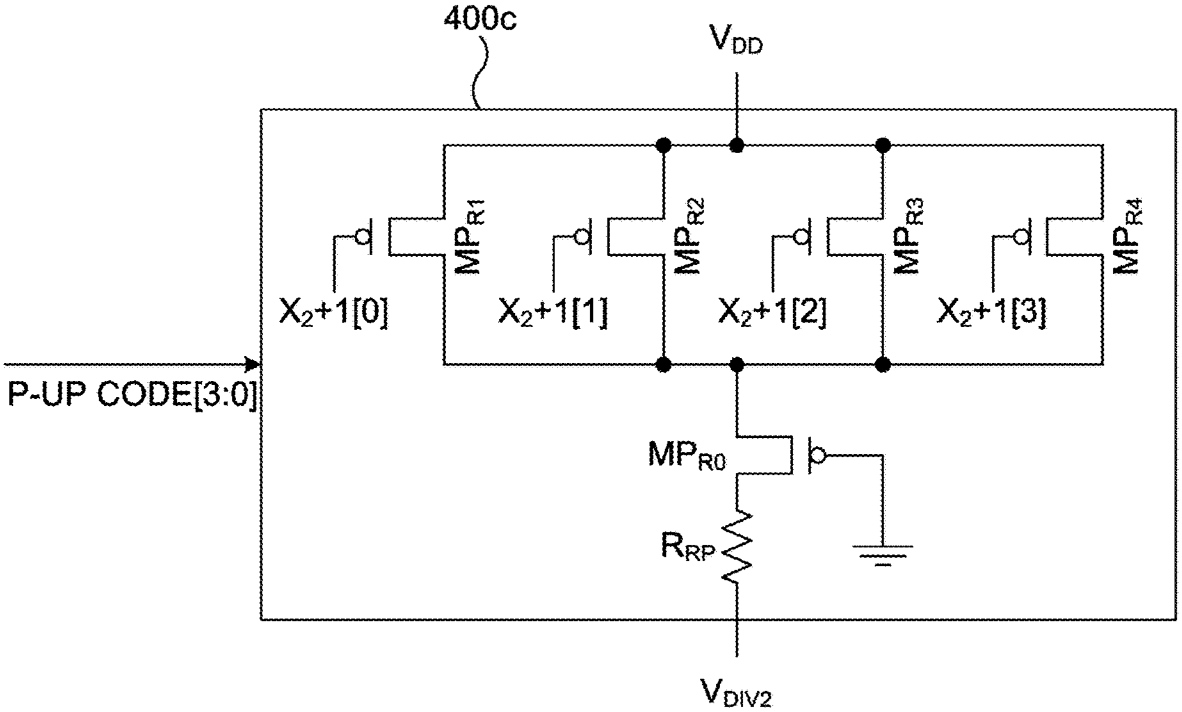
FIG. 12 is a circuit diagram illustrating a second reference resistor with a pull-up code applied thereto according to the present invention.

Therefore, the pull-up code selector 200 selects the second reference P-code [3:0] (=$X_1$+1) as the pull-up code [3:0], and applies the selected pull-up code [3:0] to the second reference resistor 400c shown in FIG. 12.

Next, to describe the pull-up code selection process of the pull-up code selector 200 for another reference P-code, it is assumed that K=4, the resistance $R_{REF1}$ of the first reference resistor 100c is 50Ω, the resistance $R_{P1}$ of the first pull-up resistor 100a and the resistance $R_{P2}$ of the second pull-up resistor 100b are both 98Ω when the first reference P-code [3:0] (=$X_2$) is applied thereto, and the resistance $R_{P1}$ of the first pull-up resistor 100a and the resistance $R_{P2}$ of the second pull-up resistor 100b are both 106Ω when the second reference P-code [3:0] (=$X_2$+1) is applied.

Figure 10A:
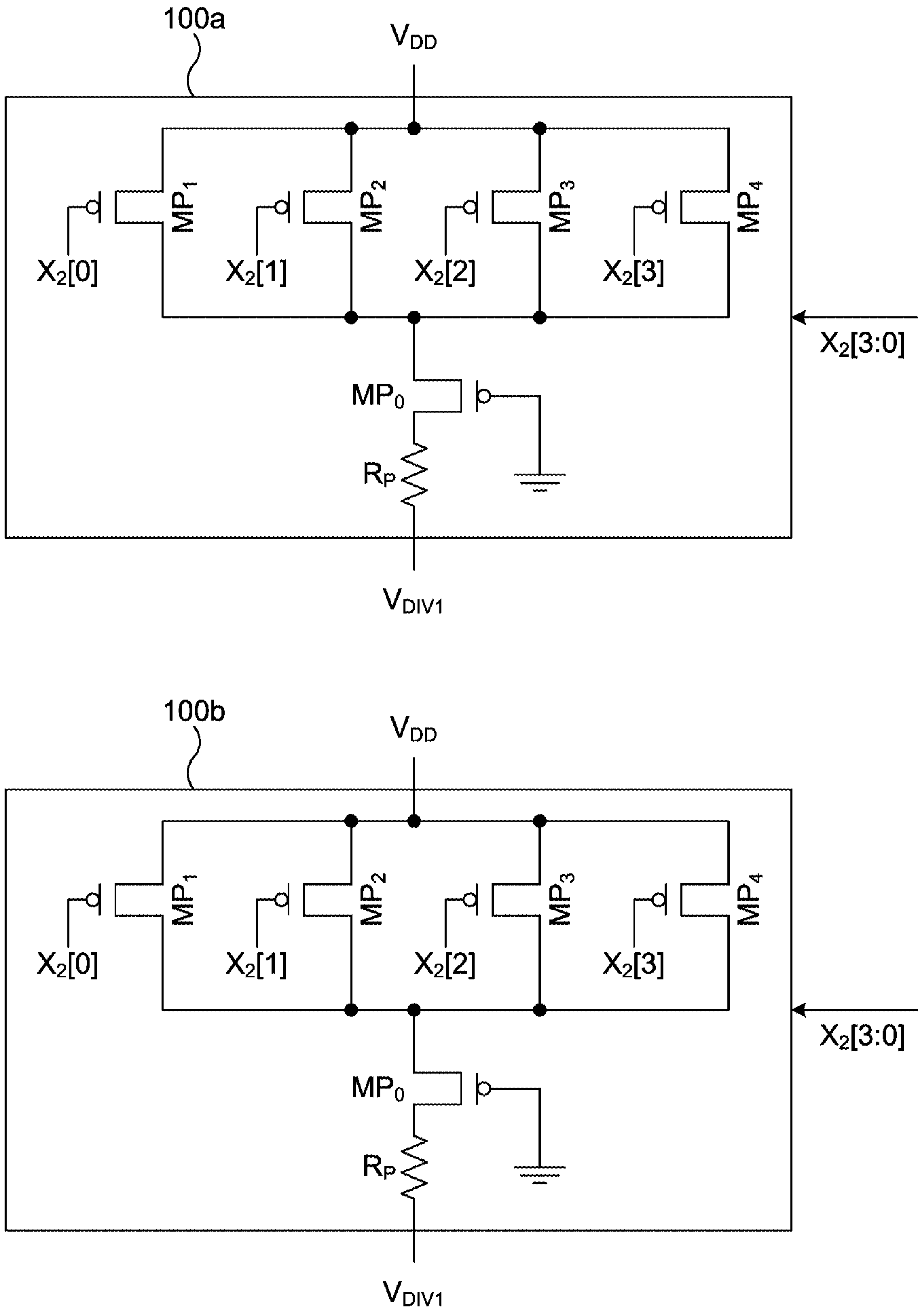
FIGS. 10A to 10C are circuit diagrams illustrating a first pull-up resistor and a second pull-up resistor, respectively, when reference P-codes $X_2$ and $X_2+1$ are applied according to the present invention.
Figure 10B:
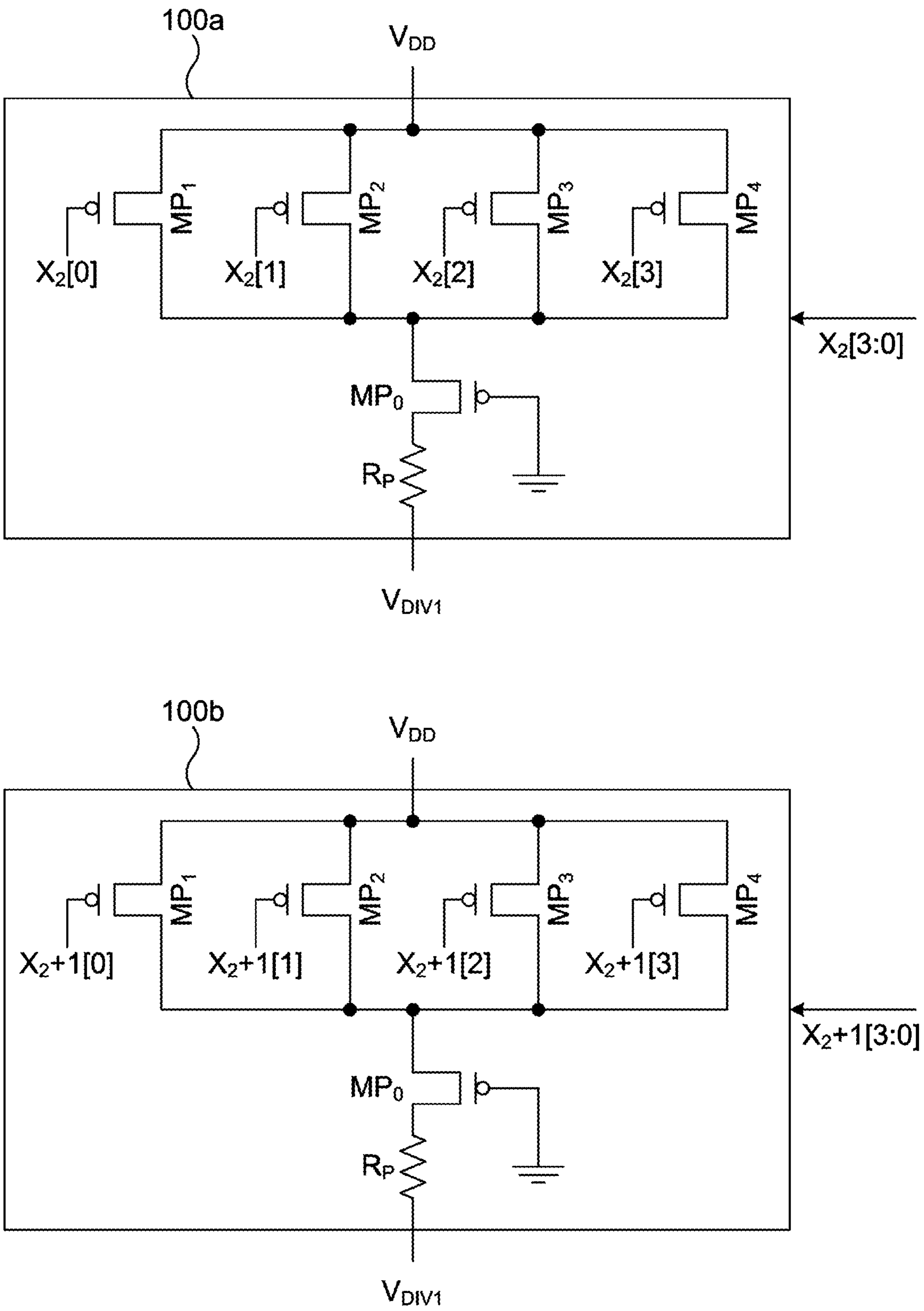
Figure 10C:
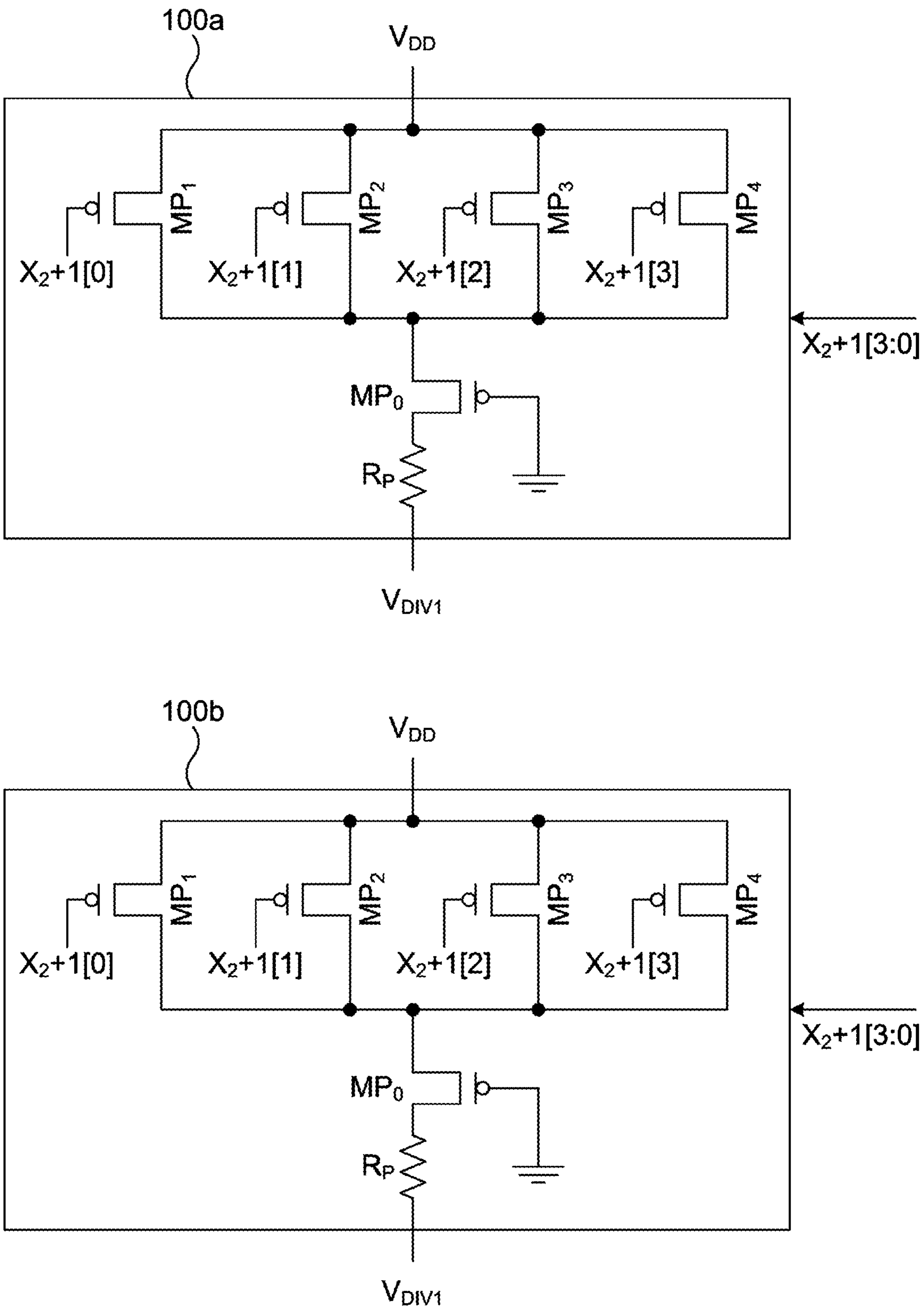

FIGS. 10A to 10C are circuit diagrams illustrating the first pull-up resistor 100a and the second pull-up resistor 100b when the first reference P-code [3:0] (=$X_2$) and the second reference P-code [3:0] (=$X_2$+1) are applied according to the present invention.

First, referring to FIG. 10A, the first reference P-code [3:0] (=$X_2$) is applied to each of the first pull-up resistor 100a and the second pull-up resistor 100b.

When $X_2$ is applied to each of the first pull-up resistor 100a and the second pull-up resistor 100b, the resistance $R_{P1}$ of the first pull-up resistor 100a and the resistance $R_{P2}$ of the second pull-up resistor 100b are both 98Ω. Thus, $R_{P1}$||RP2=49Ω.

Here, the voltage $V_{DIV11}$ across the first reference resistor 100c may be calculated from Equation 1 as shown in Equation 6 below.

[Equation 6]

$$V_{DIV11} = \frac{R_{REF1}}{(R_{P1}\|R_{P2}) + R_{REF1}} \times V_{DD} = \frac{50}{49+50} \times V_{DD} \approx 0.505V_{DD}$$

Next, referring to FIG. 10B, the first reference P-code [3:0] (=$X_2$) and the second reference P-code [3:0] (=$X_2$+1) are applied to the first pull-up resistor 100a and the second pull-up resistor 100b, respectively.

When $X_2$ and $X_2$+1 are applied to the first pull-up resistor 100a and the second pull-up resistor 100b, respectively, the resistance $R_{P1}$ of the first pull-up resistor 100a and the resistance $R_{P2}$ of the second pull-up resistor 100b are 98Ω and 106Ω, respectively. Thus, $R_{P1}\|R_{P2}$≈51Ω.

Here, the voltage $V_{DIV12}$ across the first reference resistor 100c may be calculated from Equation 1 as shown in Equation 7 below.

[Equation 7]

$$V_{DIV12} = \frac{R_{REF1}}{(R_{P1}\|R_{P2}) + R_{REF1}} \times V_{DD} = \frac{50}{51+50} \times V_{DD} \approx 0.495V_{DD}$$

Next, referring to FIG. 10C, the second reference P-code [3:0] (=$X_2$+1) is applied to each of the first pull-up resistor 100a and the second pull-up resistor 100b.

When $X_2$+1 is applied to each of the first pull-up resistor 100a and the second pull-up resistor 100b, the resistance $R_{P1}$ of the first pull-up resistor 100a and the resistance $R_{P2}$ of the second pull-up resistor 100b are both 106Ω. Thus, $R_{P1}\|R_{P2}$=53Ω.

Here, the voltage $V_{DIV13}$ across the first reference resistor 100c may be calculated from Equation 1 as shown in Equation 8 below.

[Equation 8]

$$V_{DIV13} = \frac{R_{REF1}}{(R_{P1}\|R_{P2}) + R_{REF1}} \times V_{DD} = \frac{50}{53+50} \times V_{DD} \approx 0.485V_{DD}$$

The first comparator 300 sequentially compares voltages $V_{DIV11}$, $V_{DIV12}$ and $V_{DIV13}$ to 0.5×$V_{DD}$ and outputs the comparison value $V_{COMP1}$ for each of the voltages $V_{DIV11}$, $V_{DIV12}$ and $V_{DIV13}$.

The comparison values outputted by the first comparator 300 are: $V_{COMP11}$=1 (∵0.505×$V_{DD}$>0.5×$V_{DD}$); $V_{COMP12}$=0 (∵0.495×$V_{DD}$<0.5×$V_{DD}$); and $V_{COMP13}$=0 (∵0.485×

$V_{DD}$<0.5×$V_{DD}$) where the first comparison value $V_{COMP11}$, the second comparison value $V_{COMP12}$ and the third comparison value $V_{COMP13}$ represent the comparison results for the voltages $V_{DIV11}$, $V_{DIV12}$ and $V_{DIV13}$, respectively.

Figure 11:
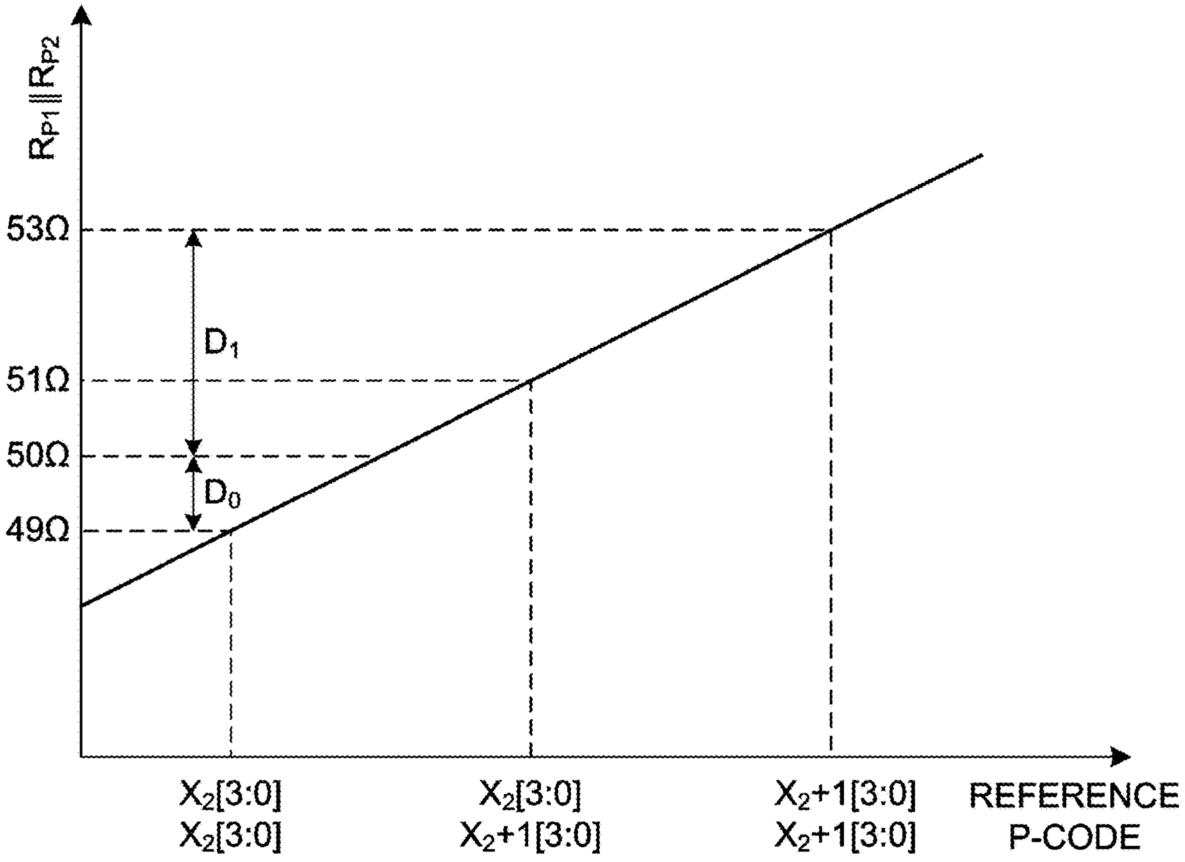
FIG. 11 is a graph illustrating resistances when the reference P-codes $X_2$ and $X_2+1$ are applied according to the present invention.

This change (1→0→0) of the first comparison value $V_{COMP11}$, the second comparison value $V_{COMP12}$ and the third comparison value $V_{COMP13}$ represents that $R_{P1}||R_{P2}$ increases as the applied reference P-code increases, as shown in FIG. 11, and in particular, when $X_2$ and $X_2+1$ are applied to the first pull-up resistor 100$a$ and the second pull-up resistor 100$b$, respectively, $R_{P1}||R_{P2}$ is already greater than 50Ω, which is the resistance $R_{REF1}$ of the first reference resistor 100$c$, and when $X_2+1$ is applied to each of the first pull-up resistor 100$a$ and the second pull-up resistor 100$b$, $R_{P1}||R_{P2}$ is much greater than the resistance $R_{REF1}$ of 50Ω of the first reference resistor 100$c$.

That is, as shown in FIG. 11, when $X_2$ is applied to each of the first pull-up resistor 100$a$ and the second pull-up resistor 100$b$, the difference Do between the resistance $R_{P1}||R_{P2}$ and the resistance $R_{REF1}$ of the first reference resistor 100$c$ is minimum ($D_0<D_1$).

Therefore, the pull-up code selector 200 selects the first reference P-code [3:0] (=$X_2$) as the pull-up code [3:0], and applies the selected pull-up code [3:0] to the second reference resistor 400$c$ shown in FIG. 12.

The pull-up code [3:0] applied to the second reference resistor 400$c$ is a reference P-code which minimizes the difference between the resistance $R_{REF2}$ of the second reference resistor 400$c$ and the resistance $R_{REF1}$ (=50Ω).

In the above-described pull-up code selection process, the first comparison value $V_{COMP11}$, the second comparison value $V_{COMP12}$ and the third comparison value $V_{COMP13}$ may have values different from those described above, which will be explained below.

In the above-described pull-up code selection process, the comparison results may be $V_{COMP11}$=1, $V_{COMP12}$=1, and $V_{COMP13}$=1. This means $V_{DIV11}$>0.5×$V_{DD}$, $V_{DIV12}$>0.5×$V_{DD}$, and $V_{DIV13}$>0.5×$V_{DD}$, respectively. That is, the voltage $V_{DIV1}$ across the first reference resistor 100$c$ in each comparison is greater than 0.5×$V_{DD}$. In such case, it is not possible to determine the pull-up code which minimizes the difference between the resistance $R_{P1}||R_{P2}$ and the resistance $R_{REF1}$ of the first reference resistor 100$c$.

Therefore, the resistance $R_{P1}||R_{P2}$ should be increased or decreased by appropriately adjusting the first reference P-code [3:0] and the second reference P-code [3:0]. In order to make any one of the first comparison value $V_{COMP11}$, the second comparison value $V_{COMP12}$, and the third comparison value $V_{COMP13}$ zero, the resistance $R_{P1}||R_{P2}$ in Equation 1 should be increased. As the first reference P-code [3:0] and the second reference P-code [3:0] increase, the resistance $R_{P1}||R_{P2}$ increases. Thus, the pull-up code selector 200 increases each of the first reference P-code [3:0] and the second reference P-code [3:0] by 1, and sequentially applies the increased first reference P-code [3:0] and the increased second reference P-code [3:0] to the first pull-up resistor 100$a$ and the second pull-up resistor 100$b$, and perform the above-described process again with the newly obtained first comparison value $V_{COMP11}$, the newly obtained second comparison value $V_{COMP12}$, and the newly obtained third comparison value $V_{COMP13}$.

Similarly, when the comparison results are $V_{COMP11}$=0, $V_{COMP12}$=0, and $V_{COMP13}$=0, each of the first reference P-code [3:0] and the second reference P-code [3:0] are decreased by 1 to decrease the resistance$R_{P1}||R_{P2}$, and the above process is performed again with the first comparison value $V_{COMP11}$, the second comparison value $V_{COMP12}$, and the third comparison value $V_{COMP13}$ newly obtained from the decreased first reference P-code [3:0] and the decreased second reference P-code [3:0].

The pull-up code selection process of the pull-up code selector 200 described above is summarized in Table 1 below.

TABLE 1

| $V_{COMP11}$ | $V_{COMP12}$ | $V_{COMP13}$ | Pull-up code |
|---|---|---|---|
| 1 | 1 | 0 | Second reference P-code |
| 1 | 0 | 0 | First reference P-code |
| 1 | 1 | 1 | Increase first and second reference P-codes by 1 |
| 0 | 0 | 0 | Decrease first and second reference P-codes by 1 |
| 0 | 0 | 1 | Non-existent comparison values |
| 0 | 1 | 1 | |
| 1 | 0 | 1 | |
| 0 | 1 | 0 | |

Hereinafter, the pull-down code selection process of the pull-down code selector 500 is described when the pull-up code [3:0], which minimizes the difference between the resistance $R_{REF2}$ of the second reference resistor 400$c$ and the resistance $R_{REF1}$ (=50Ω), is applied to the second reference resistor 400$c$.

Except that the second reference resistor 400$c$ having the resistance determined by the pull-up code [3:0] is employed instead of the first reference resistor 100$c$ having a constant resistance, the pull-down code selection process of the pull-down code selector 500 is substantially the same as that of the pull-up code selector 200.

First, in order to describe the pull-down code selection process of the pull-down code selector 500, it is assumed that K=4, the resistance $R_{REF2}$ of the second reference resistor 400$c$ is 50Ω when pull-up code [3:0] (=$X_1+1$) is applied, the resistance $R_{N1}$ of the first pull-down resistor 400$a$ and the resistance $R_{N2}$ of the second pull-down resistor 400$b$ are both 102Ω when the first reference N-code [3:0] (=$Y_1$) is applied thereto, and the resistance $R_{N1}$ of the first pull-down resistor 400$a$ and the resistance $R_{N2}$ of the second pull-down resistor 400$b$ are both 94Ω when the second reference N-code [3:0] (=$Y_1+1$) is applied.

Figure 13A:
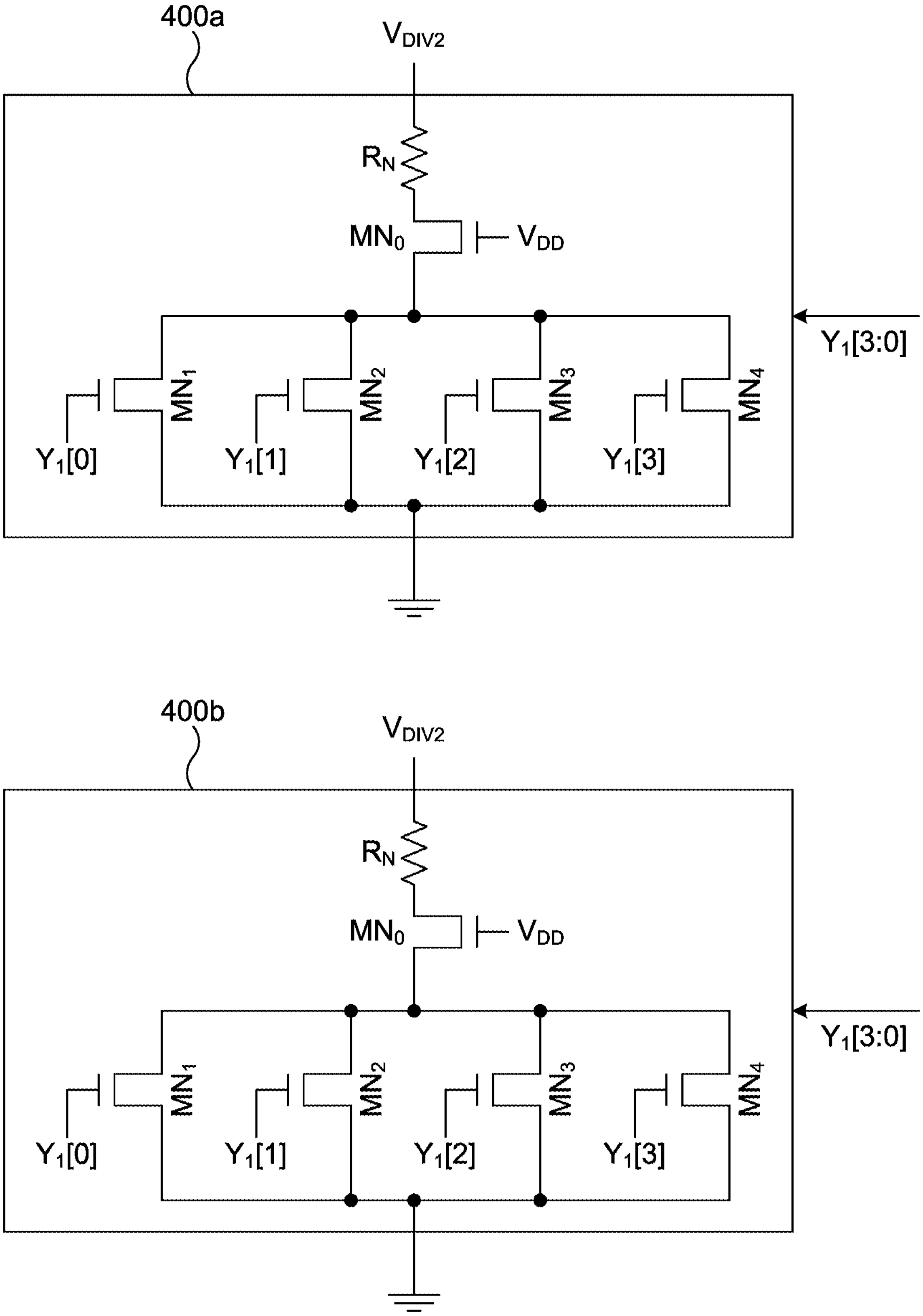
FIG. 13A to 13C are circuit diagrams illustrating a first pull-down resistor and a second pull-down resistor, respectively, when reference N-codes $Y_1$ and $Y_1+1$ are applied according to the present invention.
Figure 13B:
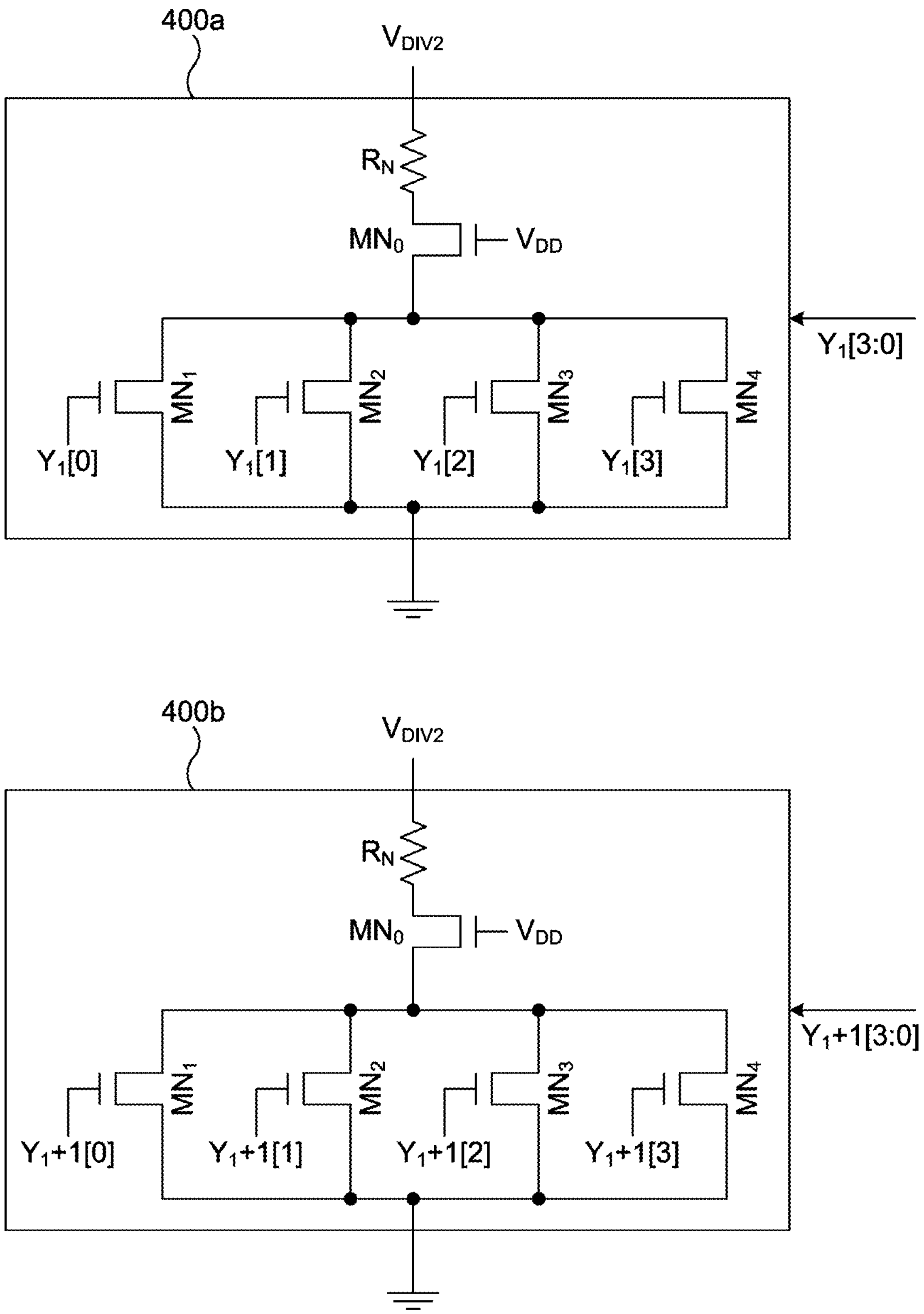
Figure 13C:
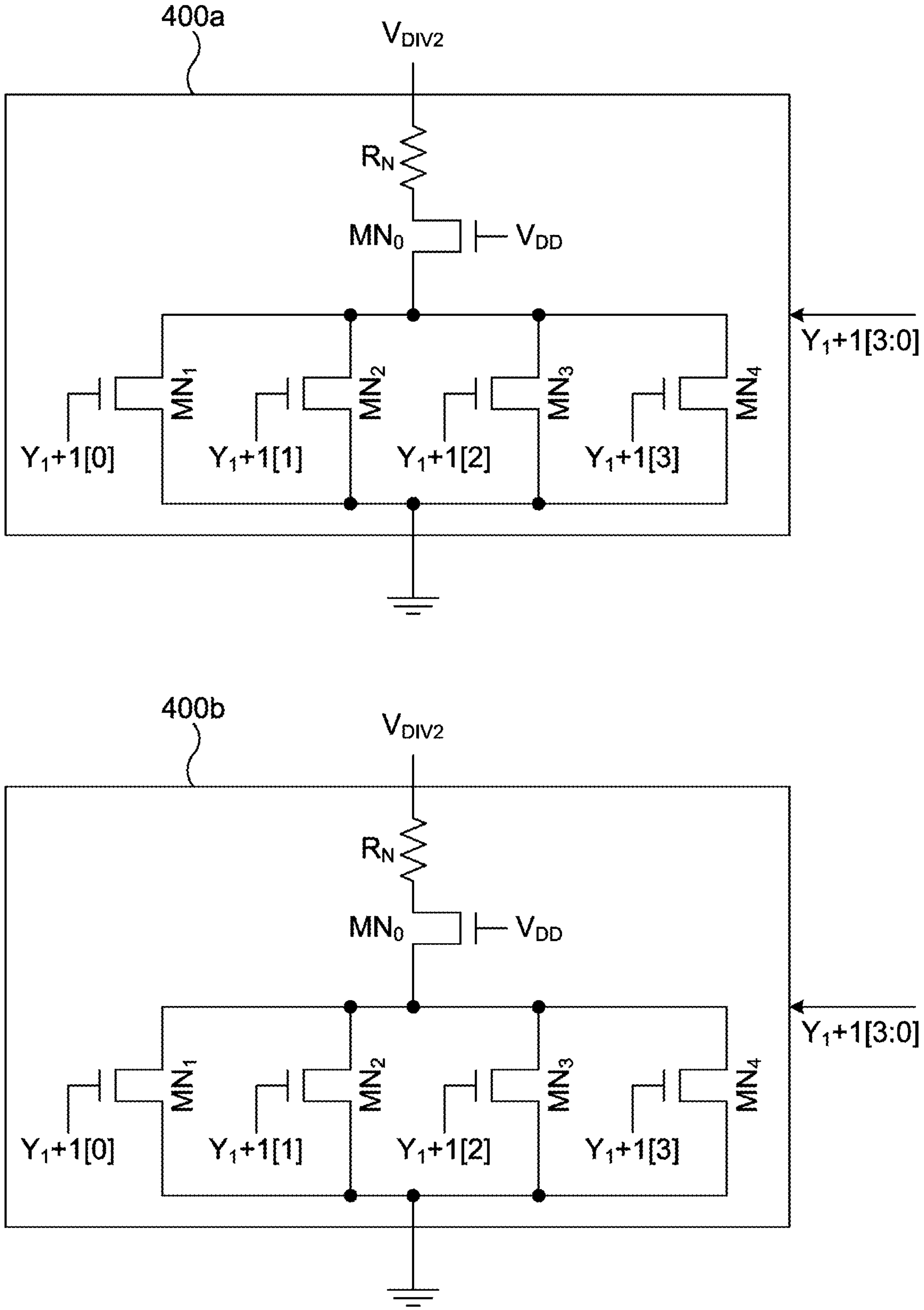

FIGS. 13A to 13C are circuit diagrams illustrating the first pull-down resistor 400$a$ and the second pull-down resistor 400$b$, respectively, when the first reference N-code [3:0] (=$Y_1$) and the second reference N-code [3:0] (=$Y_1+1$) are applied according to the present invention.

First, referring to FIG. 13A, the first reference N-code [3:0] (=$Y_1$) is applied to each of the first pull-down resistor 400$a$ and the second pull-down resistor 400$b$.

When $Y_1$ is applied to each of the first pull-down resistor 400$a$ and the second pull-down resistor 400$b$, the resistance $R_{N1}$ of the first pull-down resistor 400$a$ and the resistance $R_{N2}$ of the second pull-down resistor 400$b$ are both 102Ω. Thus, $R_{N1}||R_{N2}$=51Ω.

Here, the voltage $V_{DIV21}$ across the first pull-down resistor 400*a* and the second pull-down resistor 400*b* connected in parallel may be calculated from Equation 2 as shown in Equation 9 below.

[Equation 9]

$$V_{DIV21} = \frac{(R_{N1}\|R_{N2})}{(R_{N1}\|R_{N2}) + R_{REF2}} \times V_{DD} = \frac{51}{51+50} \times V_{DD} \approx 0.505 V_{DD}$$

Next, referring to FIG. 13B, the first reference N-code [3:0] ($=Y_1$) and the second reference N-code [3:0] ($=Y_1+1$) are applied to the first pull-down resistor 400*a* and the second pull-down resistor 400*b*, respectively.

When $Y_1$ and $Y_1+1$ are applied to the first pull-down resistor 400*a* and the second pull-down resistor 400*b*, respectively, the resistance $R_{N1}$ of the first pull-down resistor 400*a* and the resistance $R_{N2}$ of the second pull-down resistor 400*b* are 102Ω and 94Ω, respectively. Thus, $R_{N1}\|R_{N2}$~49Ω.

Here, the voltage $V_{DIV22}$ across the first pull-down resistor 400*a* and the second pull-down resistor 400*b* connected in parallel may be calculated from Equation 2 as shown in Equation 10 below.

[Equation 10]

$$V_{DIV22} = \frac{(R_{N1}\|R_{N2})}{(R_{N1}\|R_{N2}) + R_{REF2}} \times V_{DD} = \frac{49}{49+50} \times V_{DD} \approx 0.495 V_{DD}$$

Next, referring to FIG. 13C, the second reference N-code [3:0] ($=Y_1+1$) is applied to each of the first pull-down resistor 400*a* and the second pull-down resistor 400*b*.

When $Y_1+1$ is applied to each of the first pull-down resistor 400*a* and the second pull-down resistor 400*b*, the resistance $R_{N1}$ of the first pull-down resistor 400*a* and the resistance $R_{N2}$ of the second pull-down resistor 400*b* are both 94Ω. Thus, $R_{N1}\|R_{N2}$=47Ω.

Here, the voltage $V_{DIV23}$ across the first pull-down resistor 400*a* and the second pull-down resistor 400*b* connected in parallel may be calculated from Equation 2 as shown in Equation 11 below.

[Equation 11]

$$V_{DIV23} = \frac{(R_{N1}\|R_{N2})}{(R_{N1}\|R_{N2}) + R_{REF2}} \times V_{DD} = \frac{47}{47+50} \times V_{DD} \approx 0.485 V_{DD}$$

The second comparator 600 sequentially compares voltages $V_{DIV21}$, $V_{DIV22}$ and $V_{DIV23}$ to $0.5\times V_{DD}$ and outputs the comparison value $V_{COMP2}$ for each of the voltages $V_{DIV21}$, $V_{DIV22}$ and $V_{DIV23}$.

The comparison values outputted by the second comparator 600 are: $V_{COMP21}=1$ ($\because 0.505\times V_{DD}>0.5\times V_{DD}$); $V_{COMP22}=0$ ($\because 0.495\times V_{DD}<0.5\times V_{DD}$); and $V_{COMP23}=0$ ($\because 0.485\times V_{DD}<0.5\times V_{DD}$) where first comparison value $V_{COMP21}$, second comparison value $V_{COMP22}$ and third comparison value $V_{COMP23}$ represent the comparison results for the voltages $V_{DIV21}$, $V_{DIV22}$ and $V_{DIV23}$, respectively.

Figure 14:
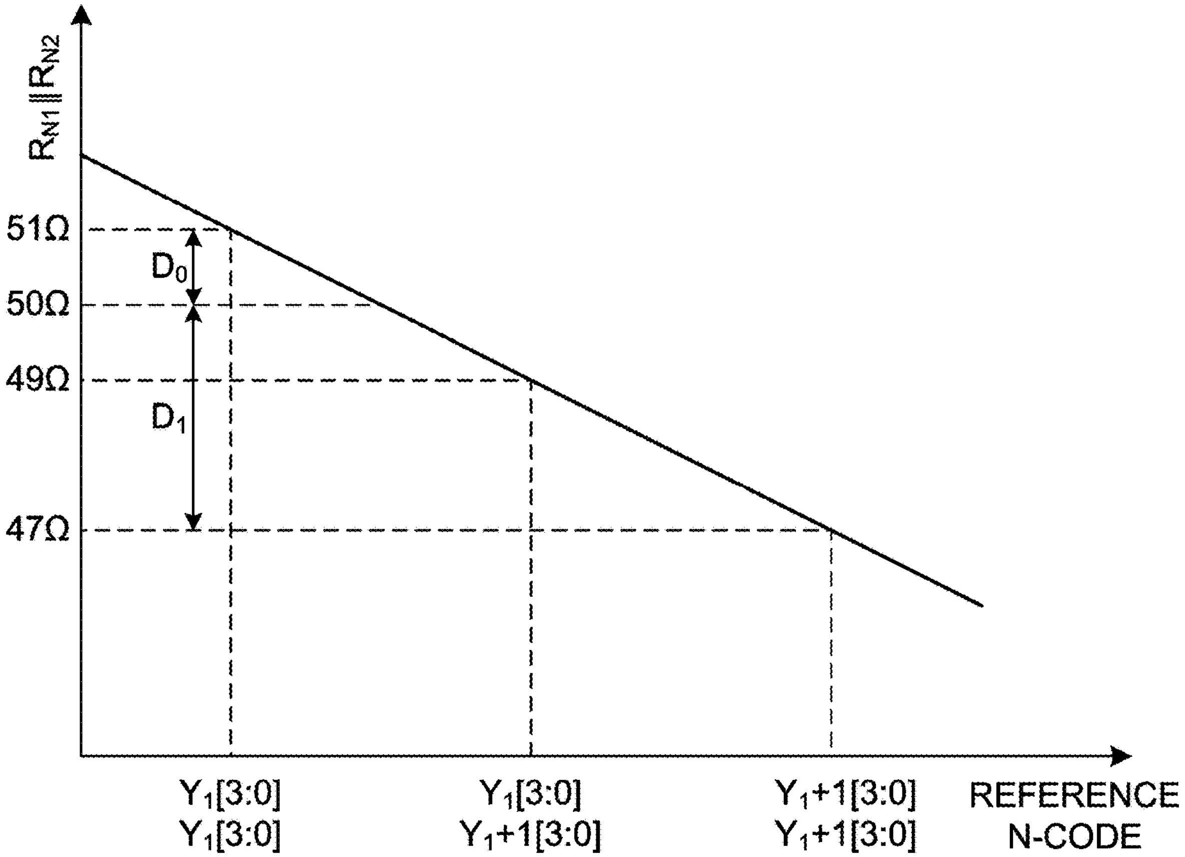
FIG. 14 is a graph illustrating resistances when the reference N-codes $Y_1$ and $Y_1+1$ are applied according to the present invention.

This change (1→0→0) of the first comparison value $V_{COMP21}$, the second comparison value $V_{COMP22}$ and the third comparison value $V_{COMP23}$ represents that $R_{N1}\|R_{N2}$ decreases as the applied reference N-code increases, as shown in FIG. 14, and in particular, when $Y_1$ and $Y_1+1$ are applied to each of the first pull-down resistor 400*a* and the second pull-down resistor 400*b*, respectively, $R_{N1}\|R_{N2}$ is smaller than 50Ω, which is the resistance $R_{REF2}$ of the second reference resistor 400*c*, and when $Y_1+1$ is applied to each of the first pull-down resistor 400*a* and the second pull-down resistor 400*b*, $R_{N1}\|R_{N2}$ is much smaller than 50Ω, which is the resistance $R_{REF2}$ of the second reference resistor 400*c*.

That is, as shown in FIG. 14, when $Y_1$ is applied to each of the first pull-down resistor 400*a* and the second pull-down resistor 400*b*, the difference Do between the resistance $R_{N1}\|R_{N2}$ and the resistance $R_{REF2}$ of the second reference resistor 400*c* is minimum ($D_0<D_1$). Therefore, the pull-down code selector 500 selects the first reference N-code [3:0] ($=Y_1$) as the pull-down code [3:0].

Next, to describe the pull-down code selection process of the pull-down code selector 500 for another reference N-code, it is assumed that K=4, the resistance $R_{REF2}$ of the second reference resistor 400*c* is 50Ω, the resistance $R_{N1}$ of the first pull-down resistor 400*a* and the resistance $R_{N2}$ of the second pull-down resistor 400*b* are both 106Ω when the first reference N-code [3:0] ($=Y_2$) is applied thereto, and the resistance $R_{N1}$ of the first pull-down resistor 400*a* and the resistance $R_{N2}$ of the second pull-down resistor 400*b* are both 98Ω when the second reference N-code [3:0] ($=Y_2+1$) is applied.

Figure 15A:
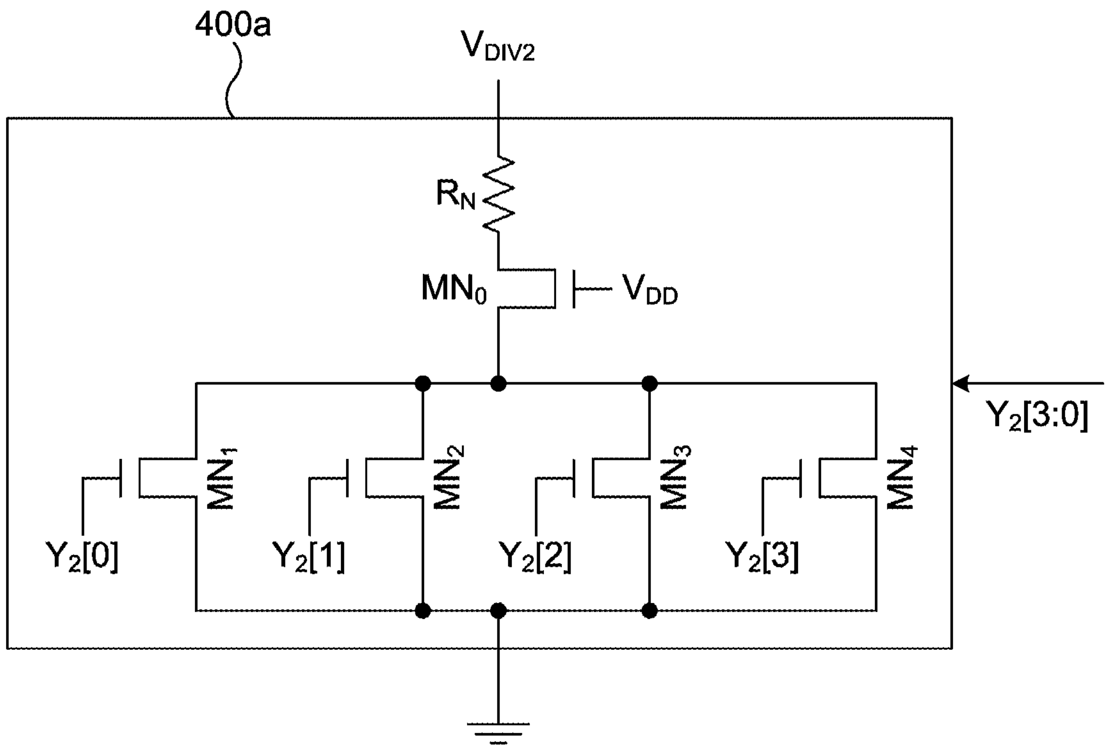
FIG. 15A to 15C are circuit diagrams illustrating a first pull-down resistor and a second pull-down resistor, respectively, when reference N-codes $Y_2$ and $Y_2+1$ are applied according to the present invention.
Figure 15A:
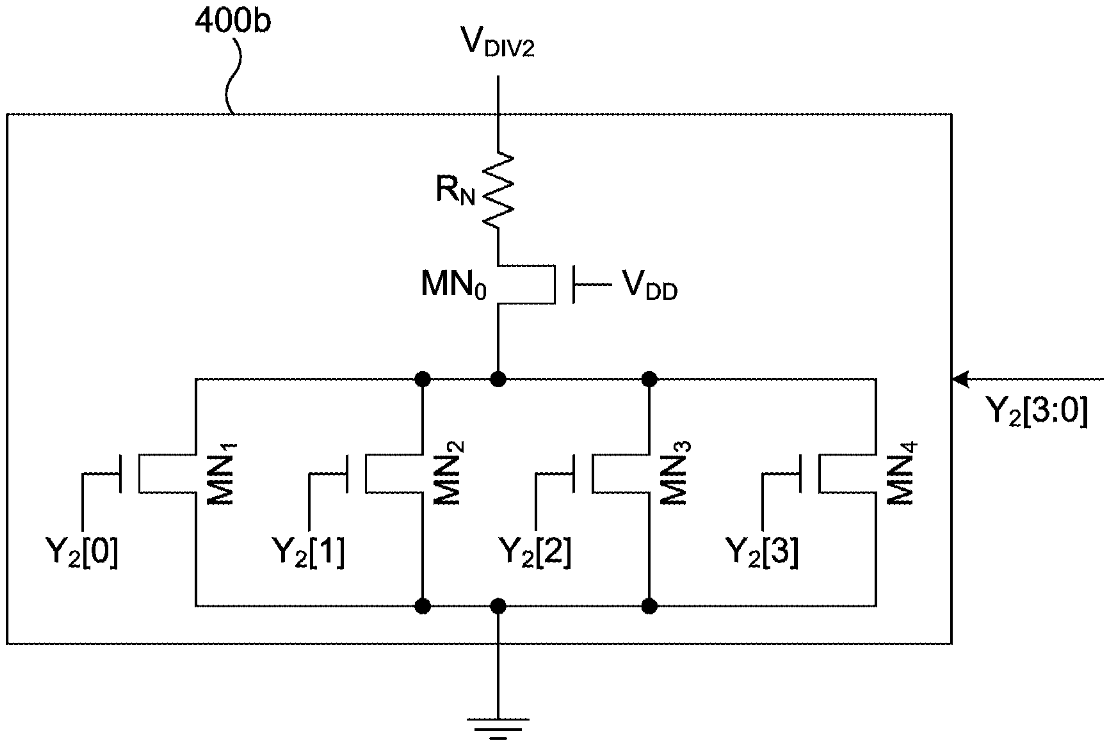
Figure 15B:
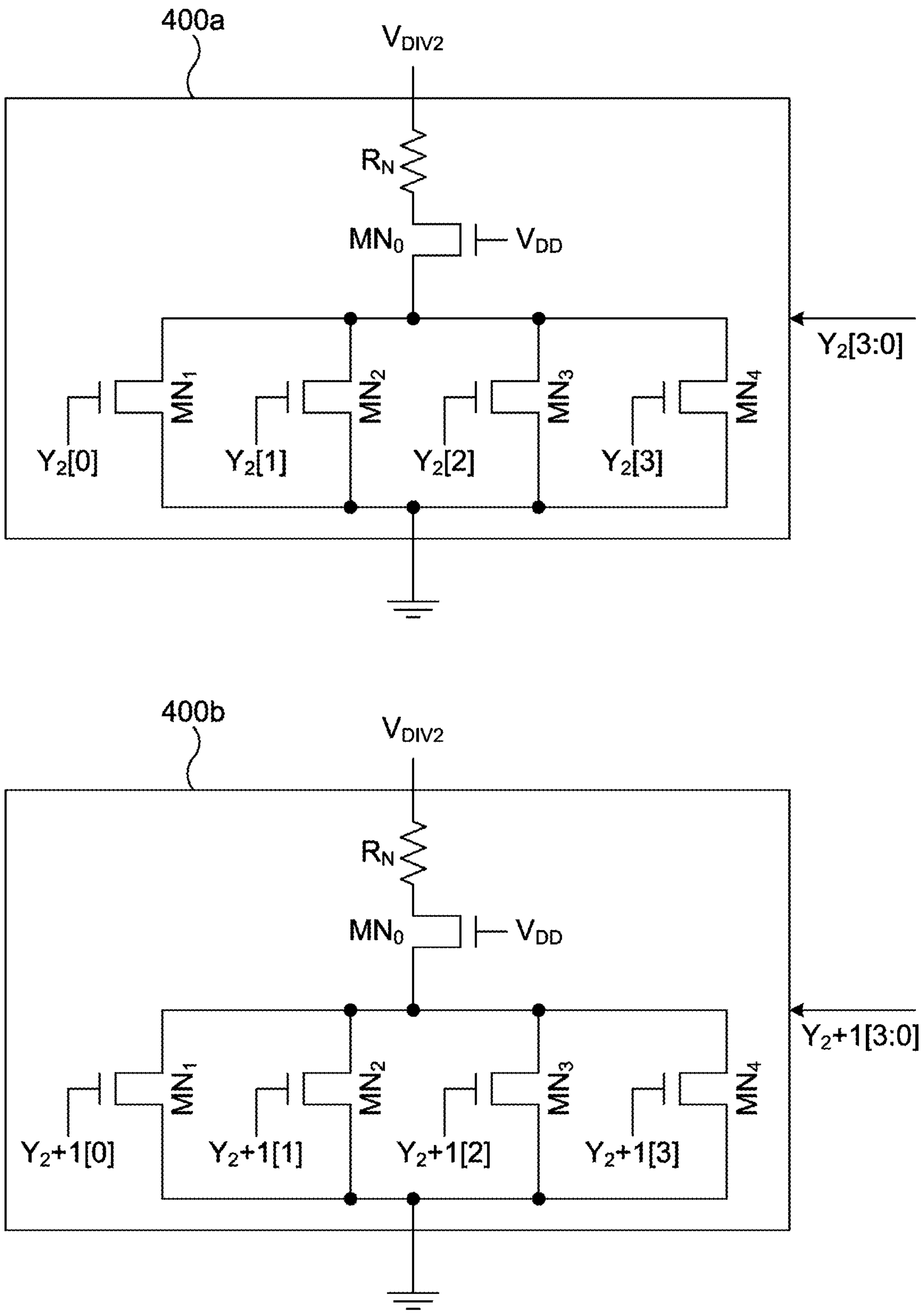
Figure 15C:
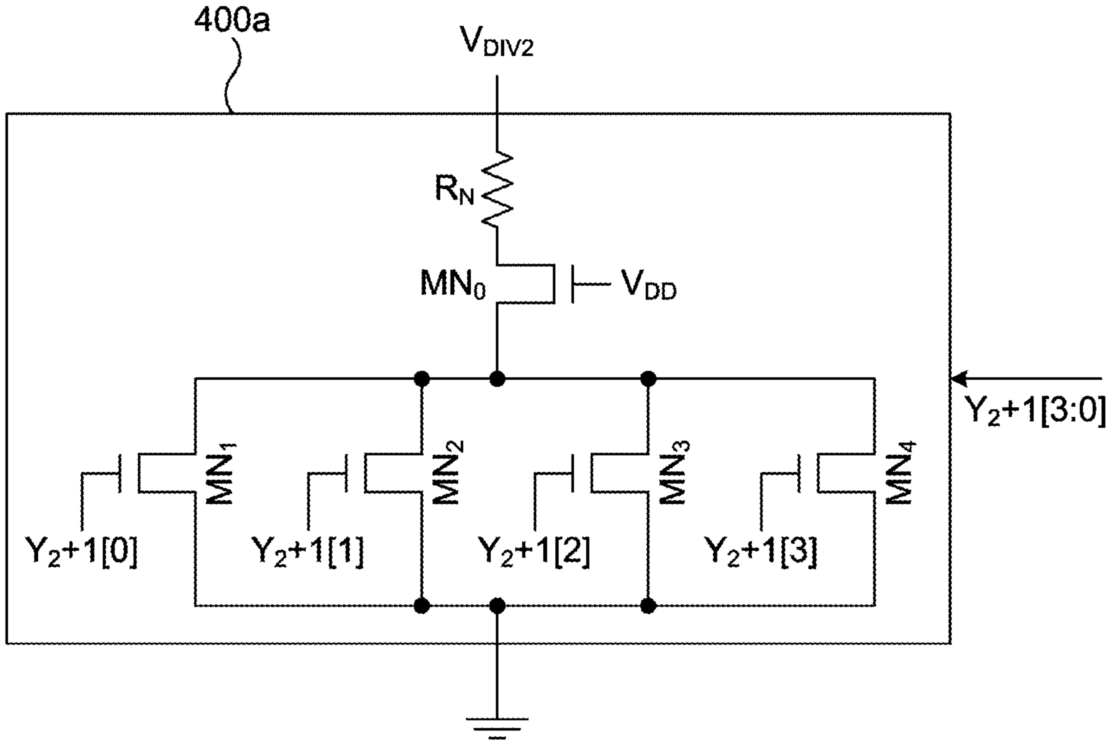
Figure 15C:
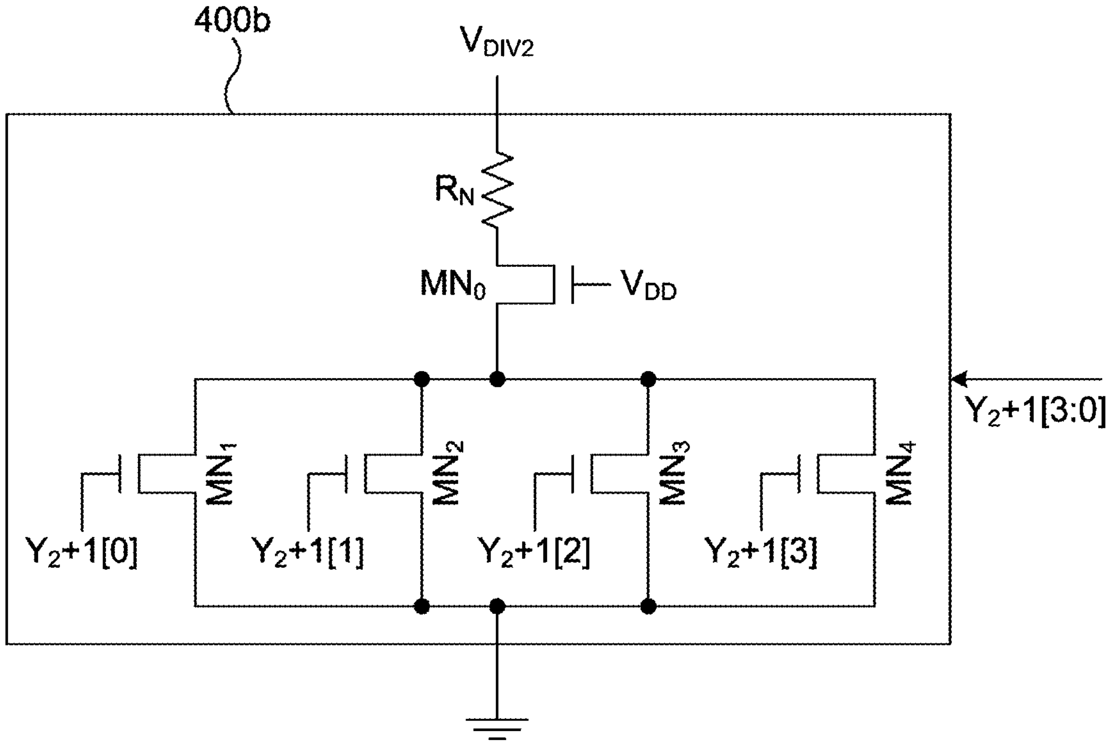

FIGS. 15A to 15C are circuit diagrams illustrating the first pull-down resistor 400*a* and the second pull-down resistor 400*b* when the first reference N-code [3:0] ($=Y_2$) and the second reference N-code [3:0] ($=Y_2+1$) are applied according to the present invention.

First, referring to FIG. 15A, the first reference N-code [3:0] ($=Y_2$) is applied to each of the first pull-down resistor 400*a* and the second pull-down resistor 400*b*.

When $Y_2$ is applied to each of the first pull-down resistor 400*a* and the second pull-down resistor 400*b*, the resistance $R_{N1}$ of the first pull-down resistor 400*a* and the resistance $R_{N2}$ of the second pull-down resistor 400*b* are both 106Ω. Thus, $R_{N1}\|R_{N2}$=53Ω.

Here, the voltage $V_{DIV21}$ across the first pull-down resistor 400*a* and the second pull-down resistor 400*b* connected in parallel may be calculated from Equation 2 as shown in Equation 12 below.

[Equation 12]

$$V_{DIV21} = \frac{(R_{N1}\|R_{N2})}{(R_{N1}\|R_{N2}) + R_{REF2}} \times V_{DD} = \frac{53}{53+50} \times V_{DD} \approx 0.515 V_{DD}$$

Next, referring to FIG. 15B, the first reference N-code [3:0] ($=Y_2$) and the second reference N-code [3:0] ($=Y_2+1$) are applied to the first pull-down resistor 400*a* and the second pull-down resistor 400*b*, respectively.

When $Y_2$ and $Y_2+1$ are applied to the first pull-down resistor 400*a* and the second pull-down resistor 400*b*, respectively, the resistance $R_{N1}$ of the first pull-down resistor 400*a* and the resistance $R_{N2}$ of the second pull-down resistor 400*b* are 106Ω and 98Ω, respectively. Thus, $R_{N1}\|R_{N2}$≈51Ω.

Here, the voltage $V_{DIV22}$ across the first pull-down resistor 400*a* and the second pull-down resistor 400*b* connected in parallel may be calculated from Equation 2 as shown in Equation 13 below.

[Equation 13]

$$V_{DIV22} = \frac{(R_{N1} \| R_{N2})}{(R_{N1} \| R_{N2}) + R_{REF2}} \times V_{DD} = \frac{51}{51+50} \times V_{DD} \approx 0.505 V_{DD}$$

Next, referring to FIG. 15C, the second reference N-code [3:0] (=$Y_2$+1) is applied to each of the first pull-down resistor 400*a* and the second pull-down resistor 400*b*.

When $Y_2$+1 is applied to each of the first pull-down resistor 400*a* and the second pull-down resistor 400*b*, the resistance $R_{N1}$ of the first pull-down resistor 400*a* and the resistance $R_{N2}$ of the second pull-down resistor 400*b* are both 98Ω. Thus, $R_{N1} \| R_{N2}$=49Ω.

Here, the voltage $V_{DIV23}$ across the first pull-down resistor 400*a* and the second pull-down resistor 400*b* connected in parallel may be calculated from Equation 2 as shown in Equation 14 below.

[Equation 14]

$$V_{DIV23} = \frac{(R_{N1} \| R_{N2})}{(R_{N1} \| R_{N2}) + R_{REF2}} \times V_{DD} = \frac{49}{49+50} \times V_{DD} \approx 0.495 V_{DD}$$

The second comparator 600 sequentially compares voltages $V_{DIV21}$, $V_{DIV22}$ and $V_{DIV23}$ to 0.5×$V_{DD}$ and outputs the comparison value $V_{COMP2}$ for each of the voltages $V_{DIV21}$, $V_{DIV22}$ and $V_{DIV23}$.

The comparison values outputted by the second comparator 600 are: $V_{COMP21}$=1 (∵0.515×$V_{DD}$>0.5×$V_{DD}$); $V_{COMP22}$=1 (0.505×$V_{DD}$>0.5×$V_{DD}$); and $V_{COMP23}$=0 (∵0.495×$V_{DD}$<0.5×$V_{DD}$) where first comparison value $V_{COMP21}$, second comparison value $V_{COMP22}$ and third comparison value $V_{COMP23}$ represent the comparison values for the voltages $V_{DIV21}$, $V_{DIV22}$ and $V_{DIV23}$, respectively.

Figure 16:
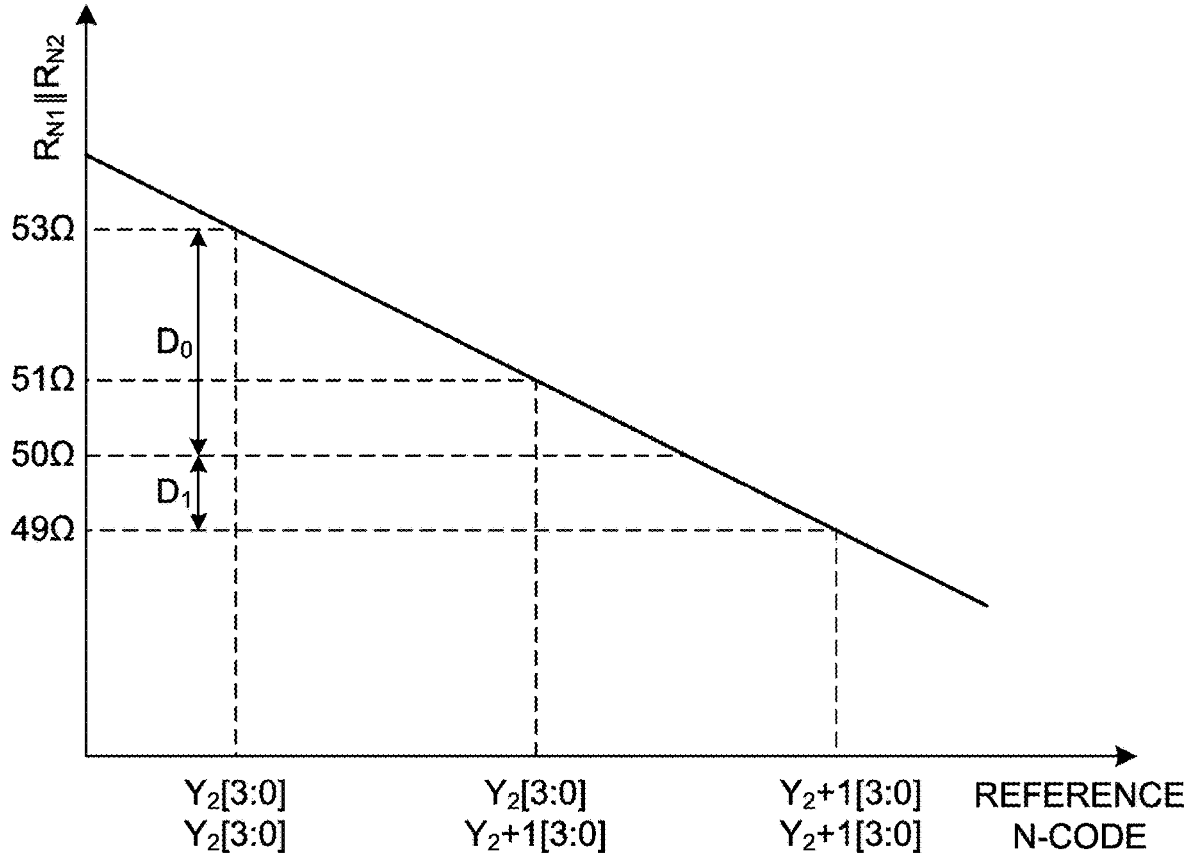
FIG. 16 is a graph illustrating resistances when the reference N-code $Y_2$ and $Y_2+1$ are applied according to the present invention.

This change (1→1→0) of the first comparison value $V_{COMP21}$, the second comparison value $V_{COMP22}$ and third comparison value $V_{COMP23}$ represents that $R_{N1} \| R_{N2}$ decreases as the applied reference N-code increases, as shown in FIG. 16, and in particular, when $Y_2$+1 is applied to each of the first pull-down resistor 400*a* and the second pull-down resistor 400*b*, $R_{N1} \| R_{N2}$ is then smaller than 50Ω, which is the resistance $R_{REF2}$ of the second reference resistor 400*c*.

value $V_{COMP22}$ and the third comparison value $V_{COMP23}$ may have values different from those described above, which will be explained below.

In the above-described pull-down code selection process, the comparison results may be $V_{COMP21}$=1, $V_{COMP22}$=1, and $V_{COMP23}$=1. This means $V_{DIV21}$>0.5×$V_{DD}$, $V_{DIV22}$>0.5×$V_{DD}$, and $V_{DIV23}$>0.5×$V_{DD}$, respectively. That is, the voltage $V_{DIV2}$ across the first pull-down resistor 400*a* and the second pull-down resistor 400*b* connected in parallel in each comparison is greater than 0.5×$V_{DD}$. In such case, it is not possible to determine the pull-down code which minimizes the difference between the resistance $R_{N1} \| R_{N2}$ and the resistance $R_{REF2}$ of the second reference resistor 400*c*.

Therefore, the resistance $R_{N1} \| R_{N2}$ should be increased or decreased by appropriately adjusting the first reference N-code [3:0] and the second reference N-code [3:0]. In order to make any one of the first comparison value $V_{COMP21}$, the second comparison value $V_{COMP22}$, and the third comparison value $V_{COMP23}$ zero, the resistance $R_{N1} \| R_{N2}$ in Equation 2 should be decreased. As the first reference N-code [3:0] and the second reference N-code [3:0] increase, the resistance $R_{N1} \| R_{N2}$ decreases. Thus, the pull-down code selector 500 increases each of the first reference N-code [3:0] and the second reference N-code [3:0] by 1, and sequentially applies the increased first reference N-code [3:0] and the increased second reference N-code [3:0] to the first pull-down resistor 400*a* and the second pull-down resistor 400*b*, and perform the above-described process again with the newly obtained first comparison value $V_{COMP21}$, the newly obtained second comparison value $V_{COMP22}$, and the newly obtained third comparison value $V_{COMP23}$.

Similarly, when the comparison results are $V_{COMP21}$=0, $V_{COMP22}$=0, and $V_{COMP2}$=0, each of the first reference N-code [3:0] and the second reference N-code [3:0] are decreased by 1 to increase the resistance $R_{N1} \| R_{N2}$, and the above process is performed again with the first comparison value $V_{COMP21}$, the second comparison value $V_{COMP22}$, and the third comparison value $V_{COMP23}$ newly obtained from the decreased first reference N-code [3:0] and the decreased second reference N-code [3:0].

The pull-down code selection process of the pull-down code selector 500 described above is summarized in Table 2 below.

TABLE 2

| $V_{COMP21}$ | $V_{COMP22}$ | $V_{COMP23}$ | Pull-down code |
|---|---|---|---|
| 1 | 1 | 0 | Second reference N-code |
| 1 | 0 | 0 | First reference N-code |
| 1 | 1 | 1 | Increase first and second reference N-codes by 1 |
| 0 | 0 | 0 | Decrease first and second reference N-codes by 1 |
| 0 | 0 | 1 | Non-existent comparison values |
| 0 | 1 | 1 | |
| 1 | 0 | 1 | |
| 0 | 1 | 0 | |

That is, as shown in FIG. 16, when $Y_2$+1 is applied to each of the first pull-down resistor 400*a* and the second pull-down resistor 400*b*, the difference $D_1$ between the resistance $R_{N1} \| R_{N2}$ and the resistance $R_{REF2}$ of the second reference resistor 400*c* is minimum ($D_0$>$D_1$). Therefore, the pull-down code selector 500 selects the first reference N-code [3:0] (=$Y_2$) as the pull-down code [3:0].

Figure 17:
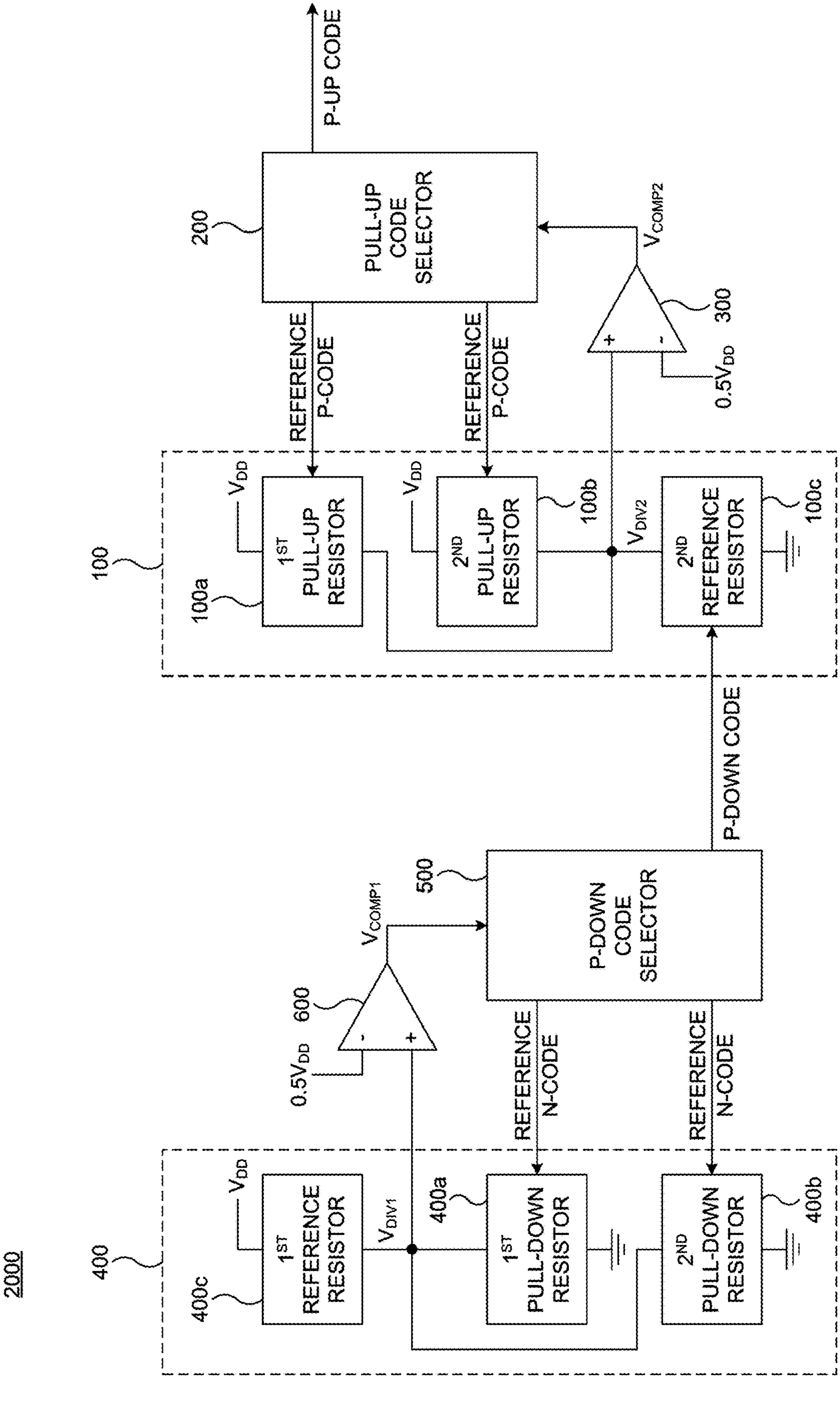
FIG. 17 is a circuit diagram illustrating a circuit capable of automatically adjusting impedance thereof according to a second embodiment of the present invention.

In the above-described pull-down code selection process, the first comparison value $V_{COMP21}$, the second comparison FIG. 17 is a circuit diagram illustrating a circuit capable of automatically adjusting impedance thereof according to a second embodiment of the present invention.

Referring to FIG. 17, a circuit 2000 capable of automatically adjusting impedance thereof according to the second embodiment of the present invention includes: a first voltage divider 400; a pull-down code selector 500; a first comparator 600; a second voltage divider 100; a pull-up code selector 200; and a second comparator 300.

The first voltage divider 400, the pull-down code selector 500, the first comparator 600, the second voltage divider 100, the pull-up code selector 200 and the second comparator 300 constituting the circuit 2000 capable of automatically adjusting impedance thereof according to the second embodiment of the present invention are identical in operation and function to the second voltage divider 400, the pull-down code selector 500, the second comparator 600, the first voltage divider 100, the pull-up code selector 200 and the first comparator 300 constituting the circuit 1000 capable of automatically adjusting impedance thereof according to the first embodiment, respectively.

However, the circuit 2000 capable of automatically adjusting impedance thereof according to the second embodiment differs from the circuit 1000 capable of automatically adjusting impedance thereof according to the first embodiment in that the pull-down code is determined first and then the pull-up code is determined, and the resistance of the second reference resistor 400*c* is constant, while the resistance of the second reference resistor 100*c* is determined by the pull-down code determined by the pull-down code selector 500.

That is, the first voltage divider 400 according to the second embodiment of the present invention includes: a first pull-down resistor 400*a* and a second pull-down resistor 400*b* connected in parallel and having resistances, respectively, varying according to a reference N-code [K-1:0] applied thereto; and a first reference resistor 400*c* having a constant resistance and connected in series with the first pull-down resistor 400*a* and the second pull-down resistor 400*b* connected in parallel, the pull-down code selector 500 according to the second embodiment of the present invention sequentially applies: a first reference N-code [K-1:0] and the first reference N-code [K-1:0] to the first pull-down resistor 400*a* and the second pull-down resistor 400*b*, respectively; the first reference N-code [K-1:0] and a second reference N-code [K-1:0] to the first pull-down resistor 400*a* and the second pull-down resistor 400*b*, respectively; and the second reference N-code [K-1:0] and the second reference N-code [K-1:0] to the first pull-down resistor 400*a* and the second pull-down resistor 400*b*, respectively, the first comparator 600 according to the second embodiment of the present invention provides a comparison value $V_{COMP1}$ to the pull-down code selector 500 wherein the comparison value $V_{COMP1}$ is obtained by comparing $0.5\times V_{DD}$ to a voltage $V_{DIV1}$ across the first pull-down resistor 400*a* and the second pull-down resistor 400*b* connected in parallel when a voltage $V_{DD}$ is applied to the first voltage divider 400, the second voltage divider 100 according to the second embodiment of the present invention includes: a second reference resistor 100*c* having a resistance varying according to a pull-down code applied by the pull-down code selector 500; and a first pull-up resistor 100*a* and a second pull-up resistor 100*b* connected in parallel and having resistances, respectively, varying according to a reference P-code [K-1:0] applied thereto wherein the first pull-up resistor 100*a* and the second pull-up resistor 100*b* are connected in series with the second reference resistor 100*c*, the pull-up code selector 200 according to the second embodiment of the present invention sequentially applies: a first reference P-code [K-1:0] and the first reference P-code [K-1:0] to the first pull-up resistor 100*a* and the second pull-up resistor 100*b*, respectively; the first reference P-code [K-1:0] and a second reference P-code [K-1:0] to the first pull-up resistor 100*a* and the second pull-up resistor 100*b*, respectively; and the second reference P-code [K-1:0] and the second reference P-code [K-1:0] to the first pull-up resistor 100*a* and the second pull-up resistor 100*b*, respectively; and the second comparator 300 according to the second embodiment of the present invention provides a comparison value $V_{COMP2}$ to the pull-up code selector 200 wherein the comparison value $V_{COMP2}$ is obtained by comparing $0.5\times V_{DD}$ to a voltage $V_{DIV2}$ across the second reference resistor 100*c* when the voltage $V_{DD}$ is applied to the second voltage divider 100.

In addition, the first comparator 600 according to the second embodiment of the present invention performs a comparison each time the reference N-code [K-1:0] is applied and provides three comparison values $V_{COMP1}$ to the pull-down code selector 500, the pull-down code selector 500 selects one of the first reference N-code [K-1:0] and the second reference N-code [K-1:0] as a pull-down code based on the three comparison values $V_{COMP1}$, the pull-down code minimizing a difference between: a resistance of the first reference resistor 400*c*; and a resistance of the first pull-down resistor 400*a* and the second pull-down resistor 400*b* connected in parallel, the second comparator 300 performs a comparison each time the reference P-code [K-1:0] is applied and provides three comparison values $V_{COMP2}$ to the pull-up code selector 200, and the pull-up code selector 200 selects one of the first reference P-code [K-1:0] and the second reference P-code [K-1:0] as a pull-up code based on the three comparison values $V_{COMP2}$, the pull-up code minimizing the difference between: a resistance of the second reference resistor 100*c*; and a resistance of the first pull-up resistor 100*a* and the second pull-up resistor 100*b* connected in parallel (where "second reference N-code [K-1:0]" is equal to "first reference N-code [K-1:0]+1", and "second reference P-code [K-1:0]" is equal to "first reference P-code [K-1:0]+1").

The circuit capable of automatically adjusting impedance thereof according to the present invention has the following advantages.

(1) The circuit capable of automatically adjusting impedance thereof according to the present invention is advantageous in that large PVT changes may be dealt with due to the wide adjustment range of impedance.

(2) The circuit capable of automatically adjusting impedance thereof according to the present invention is advantageous in that internal resistance may be adjusted as closely as possible to the resistance of an external reference resistor with high accuracy.

What is claimed is:

1. A circuit capable of automatically adjusting impedance thereof, the circuit comprising:

a first voltage divider comprising: a first pull-up resistor and a second pull-up resistor connected in parallel and having resistances, respectively, varying according to a reference P-code applied thereto; and a first reference resistor having a constant resistance and connected in series with the first pull-up resistor and the second pull-up resistor connected in parallel, a pull-up code selector sequentially applying: a first reference P-code and the first reference P-code; the first reference P-code and a second reference P-code; and the second reference P-code and the second reference P-code to the first pull-up resistor and the second pull-up resistor, respectively;

a first comparator providing a comparison value $V_{COMP1}$ to the pull-up code selector wherein the comparison value $V_{COMP1}$ is obtained by comparing $0.5\times V_{DD}$ to a voltage $V_{DIV1}$ across the first reference resistor when a voltage $V_{DD}$ is applied to the first voltage divider;

a second voltage divider comprising: a second reference resistor having a resistance varying according to a pull-up code applied by the pull-up code selector; and a first pull-down resistor and a second pull-down resistor connected in parallel and having resistances, respectively, varying according to a reference N-code applied thereto wherein the first pull-down resistor and the second pull-down resistor are connected in series with the second reference resistor;

a pull-down code selector sequentially applying: a first reference N-code and the first reference N-code; the first reference N-code and a second reference N-code; and the second reference N-code and the second reference N-code to the first pull-down resistor and the second pull-down resistor, respectively; and a second comparator providing a comparison value $V_{COMP2}$ to the pull-down code selector wherein the comparison value $V_{COMP2}$ is obtained by comparing $0.5\times V_{DD}$ to a voltage $V_{DIV2}$ across the first pull-down resistor and the second pull-down resistor when the voltage $V_{DD}$ is applied to the second voltage divider, wherein the first comparator performs a comparison each time the reference P-code is applied and provides three comparison values $V_{COMP1}$ to the pull-up code selector, the pull-up code selector selects one of the first reference P-code and the second reference P-code as a pull-up code based on the three comparison values $V_{COMP1}$, the pull-up code minimizing a difference between: a resistance of the first reference resistor; and a resistance of the first pull-up resistor and the second pull-up resistor connected in parallel, the second comparator performs a comparison each time the reference N-code is applied and provides three comparison values $V_{COMP2}$ to the pull-down code selector, and the pull-down code selector selects one of the first reference N-code and the second reference N-code as a pull-down code based on the three comparison values $V_{COMP2}$, the pull-down code minimizing the difference between: a resistance of the second reference resistor; and a resistance of the first pull-down resistor and the second pull-down resistor connected in parallel, wherein the second reference P-code is equal to the first reference P-code+1, and the second reference N-code is equal to the first reference N-code+1.

2. The circuit of claim 1, wherein the reference P-code comprises binary data of K bits, and each of the first pull-up resistor and the second pull-up resistor comprises K counts of PMOS transistors provided with gates having the binary data of K bits applied thereto, respectively, wherein K is a natural number.

3. The circuit of claim 1, wherein the three comparison values $V_{COMP1}$ comprise a first comparison value, a second comparison value and a third comparison value, and the pull-up code selector selects the first reference P-code as the pull-up code when the first comparison value=1, the second comparison value=0 and the third comparison value=0 are satisfied, and selects the second reference P-code as the pull-up code when the first comparison value=1, the second comparison value=1 and the third comparison value=0 are satisfied.

4. The circuit of claim 3, wherein the pull-up code selector:

(i) increases each of the first reference P-code and the second reference P-code by 1 and then sequentially applies increased first reference P-code and increased second reference P-code to the first pull-up resistor and the second pull-up resistor when the first comparison value=1, the second comparison value=1, and the third comparison value=1 are satisfied; and (ii) selects one of the increased first reference P-code and the increased second reference P-code as the pull-up code based on comparison values of the first comparator obtained from the increased first reference P-code and the increased second reference P-code, the pull-up code minimizing the difference between: the resistance of the first reference resistor; and the resistance of the first pull-up resistor and the second pull-up resistor connected in parallel.

5. The circuit of claim 4, wherein the pull-up code selector:

(i) decreases each of the first reference P-code and the second reference P-code by 1 and then sequentially applies decreased first reference P-code and decreased second reference P-code to the first pull-up resistor and the second pull-up resistor when the first comparison value=0, the second comparison value=0, and the third comparison value=0 are satisfied; and (ii) selects one of the decreased first reference P-code and the decreased second reference P-code as the pull-up code based on comparison values of the first comparator obtained from the decreased first reference P-code and the decreased second reference P-code, the pull-up code minimizing the difference between: the resistance of the first reference resistor; and the resistance of the first pull-up resistor and the second pull-up resistor connected in parallel.

6. The circuit of claim 1, wherein the reference N-code comprises binary data of K bits, and each of the first pull-down resistor and the second pull-down resistor comprises K counts of NMOS transistors provided with gates having the binary data of K bits applied thereto, respectively, wherein K is a natural number.

7. The circuit of claim 1, wherein the three comparison values $V_{COMP2}$ comprise a first comparison value, a second comparison value and a third comparison value, and the pull-down code selector selects the first reference N-code as the pull-down code when the first comparison value=1, the second comparison value=0 and the third comparison value=0 are satisfied, and selects the second reference N-code as the pull-down code when the first comparison value=1, the second comparison value=1 and the third comparison value=0 are satisfied.

8. The circuit of claim 7, wherein the pull-down code selector:

(i) increases each of the first reference N-code and the second reference N-code by 1 and then sequentially applies increased first reference N-code and increased second reference N-code to the first pull-down resistor and the second pull-down resistor when the first comparison value=1, the second comparison value=1, and the third comparison value=1 are satisfied; and (ii) selects one of the increased first reference N-code and the increased second reference N-code as the pull-down code based on comparison values of the second comparator obtained from the increased first reference N-code and the increased second reference N-code, the pull-down code minimizing the difference between: the resistance of the second reference resistor; and the resistance of the first pull-down resistor and the second pull-down resistor connected in parallel.

9. The circuit of claim 8, wherein the pull-down code selector:

(i) decreases each of the first reference N-code and the second reference N-code by 1 and then sequentially applies decreased first reference N-code and decreased second reference N-code to the first pull-down resistor and the second pull-down resistor when the first comparison value=0, the second comparison value=0, and the third comparison value=0 are satisfied; and (ii) selects one of the decreased first reference N-code and the decreased second reference N-code as the pull-down code based on comparison values of the second comparator obtained from the decreased first reference N-code and the decreased second reference N-code, the pull-down code minimizing the difference between: the resistance of the second reference resistor; and the resistance of the first pull-down resistor and the second pull-down resistor connected in parallel.

10. A circuit capable of automatically adjusting impedance thereof, the circuit comprising:

a first voltage divider comprising: a first pull-down resistor and a second pull-down resistor connected in parallel and having resistances, respectively, varying according to a reference N-code applied thereto; and a first reference resistor having a constant resistance and connected in series with the first pull-down resistor and the second pull-down resistor connected in parallel, a pull-down code selector sequentially applying: a first reference N-code and the first reference N-code; the first reference N-code and a second reference N-code; and the second reference N-code and the second reference N-code to the first pull-down resistor and the second pull-down resistor, respectively;

a first comparator providing a comparison value $V_{COMP1}$ to the pull-down code selector wherein the comparison value $V_{COMP1}$ is obtained by comparing $0.5 \times V_{DD}$ to a voltage $V_{DIV1}$ across the first pull-down resistor and the second pull-down resistor connected in parallel when a voltage $V_{DD}$ is applied to the first voltage divider;

a second voltage divider comprising: a second reference resistor having a resistance varying according to a pull-down code applied by the pull-down code selector; and a first pull-up resistor and a second pull-up resistor connected in parallel and having resistances, respectively, varying according to a reference P-code applied thereto wherein the first pull-up resistor and the second pull-up resistor are connected in series with the second reference resistor;

a pull-up code selector sequentially applying: a first reference P-code and the first reference P-code; the first reference P-code and a second reference P-code; and the second reference P-code and the second reference P-code to the first pull-up resistor and the second pull-up resistor, respectively; and a second comparator providing a comparison value $V_{COMP2}$ to the pull-up code selector wherein the comparison value $V_{COMP2}$ is obtained by comparing $0.5 \times V_{DD}$ to a voltage $V_{DIV2}$ across the second reference resistor when the voltage $V_{DD}$ is applied to the second voltage divider, wherein the first comparator performs a comparison each time the reference N-code is applied and provides three comparison values $V_{COMP1}$ to the pull-down code selector, the pull-down code selector selects one of the first reference N-code and the second reference N-code as a pull-down code based on the three comparison values $V_{COMP1}$, the pull-down code minimizing a difference between: a resistance of the first reference resistor; and a resistance of the first pull-down resistor and the second pull-down resistor connected in parallel, the second comparator performs a comparison each time the reference P-code is applied and provides three comparison values $V_{COMP2}$ to the pull-up code selector, and the pull-up code selector selects one of the first reference P-code and the second reference P-code as a pull-up code based on the three comparison values $V_{COMP2}$, the pull-up code minimizing the difference between: a resistance of the second reference resistor; and a resistance of the first pull-up resistor and the second pull-up resistor connected in parallel, wherein the second reference N-code is equal to the first reference N-code+1, and the second reference P-code is equal to the first reference P-code+1.

* * * * *